United States Patent
Matsuyama et al.

(10) Patent No.: US 11,822,180 B2
(45) Date of Patent: *Nov. 21, 2023

(54) POLARIZER AND IMAGE DISPLAY DEVICE

(71) Applicant: FUJIFILM Corporation, Tokyo (JP)

(72) Inventors: Hiroshi Matsuyama, Kanagawa (JP); Wataru Hoshino, Kanagawa (JP); Teruki Niori, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/897,934

(22) Filed: Aug. 29, 2022

(65) Prior Publication Data

US 2023/0028750 A1  Jan. 26, 2023

Related U.S. Application Data

(63) Continuation of application No. 16/907,811, filed on Jun. 22, 2020, now Pat. No. 11,467,442, which is a (Continued)

(30) Foreign Application Priority Data

Dec. 28, 2017  (JP) ................................ 2017-254571

(51) Int. Cl.
  *G02F 1/1335* (2006.01)
  *C09K 19/38* (2006.01)
  (Continued)

(52) U.S. Cl.
  CPC .... *G02F 1/133528* (2013.01); *C09K 19/3852* (2013.01); *G02B 5/3016* (2013.01); (Continued)

(58) Field of Classification Search
  CPC ............ G02F 1/133528; G02B 5/3016; G02B 5/3025; G02B 5/3033; C09K 19/3852; (Continued)

(56) References Cited

U.S. PATENT DOCUMENTS 11,339,329 B2   5/2022  Hoshino et al.
11,467,442 B2 * 10/2022  Matsuyama .............. G09F 9/30
(Continued)

FOREIGN PATENT DOCUMENTS

CN    102822704 A    12/2012
CN    103033868 A     4/2013
(Continued)

OTHER PUBLICATIONS

International Search Report issued in PCT/JP2018/048530 dated Mar. 5, 2019.

(Continued)

*Primary Examiner* — Sophie Hon
(74) *Attorney, Agent, or Firm* — Edwards Neils LLC; Jean C. Edwards, Esq.

(57) ABSTRACT

Provided is a polarizer having a high degree of alignment and an image display device including the polarizer. The polarizer is formed of a polarizer-forming composition containing a polymer liquid crystal compound and a dichroic material, in which the polymer liquid crystal compound is a thermotropic liquid crystal and a crystalline polymer, and the polymer liquid crystal compound and the dichroic material are horizontally aligned.

19 Claims, 1 Drawing Sheet

Related U.S. Application Data continuation of application No. PCT/JP2018/048530, filed on Dec. 28, 2018.

(51) Int. Cl.
*G02F 1/1333* (2006.01)
*G02B 5/30* (2006.01)
*G02F 1/1339* (2006.01)

(52) U.S. Cl.
CPC .. *G02F 1/133365* (2013.01); *C09K 2323/031* (2020.08); *C09K 2323/035* (2020.08); *G02F 1/13398* (2021.01)

(58) Field of Classification Search
CPC ............... C09K 19/60; C09K 19/601; C09K 2019/0448; C09K 2019/2078; C09K 2323/031; C09K 2323/035
See application file for complete search history.

(56) References Cited

U.S. PATENT DOCUMENTS

| | | |
|---|---|---|
| 2007/0286968 A1 | 12/2007 | Takeuchi et al. |
| 2008/0151165 A1 | 6/2008 | Takemoto |
| 2009/0267031 A1 | 10/2009 | Sano et al. |
| 2009/0323012 A1 | 12/2009 | He et al. |
| 2010/0267858 A1 | 10/2010 | Lub et al. |
| 2011/0177315 A1 | 7/2011 | Iwahashi et al. |
| 2011/0178200 A1 | 7/2011 | Parri et al. |
| 2012/0256124 A1 | 10/2012 | Ohgiri et al. |
| 2013/0070899 A1 | 3/2013 | Morishima et al. |
| 2014/0014877 A1 | 1/2014 | Mizumura et al. |
| 2015/0029445 A1 | 1/2015 | Takeda et al. |
| 2015/0277007 A1 | 10/2015 | Matsuyama et al. |
| 2015/0344782 A1 | 12/2015 | Matsuyama et al. |
| 2016/0108315 A1 | 4/2016 | Matsuyama et al. |
| 2016/0170114 A1 | 6/2016 | Watano et al. |
| 2016/0370523 A1 | 12/2016 | Shimoju et al. |
| 2017/0121605 A1 | 5/2017 | Hida et al. |
| 2017/0240810 A1 | 8/2017 | Hida et al. |
| 2018/0067348 A1 | 3/2018 | Hatanaka |
| 2018/0346633 A1 | 12/2018 | Hoshino et al. |
| 2019/0101676 A1 | 4/2019 | Katou et al. |

FOREIGN PATENT DOCUMENTS

| | | | |
|---|---|---|---|
| CN | 103443246 A | 12/2013 | |
| CN | 105247012 A | 1/2016 | |
| CN | 105492935 A | 4/2016 | |
| CN | 106104323 A | 11/2016 | |
| JP | H11-101964 A | 4/1999 | |
| JP | H11-326638 A | 11/1999 | |
| JP | 2002-011951 A | 1/2002 | |
| JP | 2002-207118 A | 7/2002 | |
| JP | 3594868 B2 * | 12/2004 | .......... C09K 19/3852 |
| JP | 2006-193722 A | 7/2006 | |
| JP | 2009-294358 A | 12/2009 | |
| JP | 2011-526321 A | 10/2011 | |
| JP | 2011-237513 A | 11/2011 | |
| JP | 2012-078501 A | 4/2012 | |
| JP | 2013-217964 A | 10/2013 | |
| KR | 10-2012-0008425 A | 1/2012 | |
| KR | 10-2017-0127013 A | 11/2017 | |
| TW | 200615366 A | 5/2006 | |
| TW | 200938613 A | 9/2009 | |
| WO | 2016/060174 A1 | 4/2016 | |
| WO | WO-2016060174 A1 * | 4/2016 | ........... C07C 245/08 |
| WO | 2017/154907 A1 | 9/2017 | |
| WO | 2017/170036 A1 | 10/2017 | |

OTHER PUBLICATIONS

Written Opinion issued in PCT/JP2018/048530 dated Mar. 5, 2019.
International Preliminary Report on Patentability completed by WIPO dated Jun. 30, 2020 in connection with International Patent Application No. PCT/JP2018/048530.
Office Action, issued by the Japanese Patent Office dated Jun. 2, 2020, in connection with Japanese Patent Application No. 2019-562516.
Office Action, issued by the State Intellectual Property Office dated Sep. 29, 2021, in connection with Chinese Patent Application No. 201880083665.X.
Yan-Hua Cheng et al., Influences of Hydrogen Bonding and Peripheral Chain Length on Mesophase Structures of Mesogen-Jacketed Liquid Crystalline Polymers with Amide Side-Chain Linkages, Macromolecules, Feb. 14, 2011, 44, 6, 1429-1437, American Chemical Society.
Huang Jun-Zuo et al., The Properties and Potential Applications of Functional Side-Chain Liquid Crystalline Polymethacrylate Bearing Para-methoxy-phenylaminocarbonylazobenzene Group, Feb. 2008., 50-58, China Academic Journal Electronic Publishing House.
Office Action, issued by the Korean Intellectual Property Office dated Dec. 27, 2021, in connection with Korean Patent Application No. 10-2020-7018121.
Non-Final Office Action Issue in U.S. Appl. No. 16/907,811 dated Feb. 18, 2022.
Office Action, which was issued by the Korean Intellectual Property Office dated Sep. 26, 2022, in connection with orean Patent Application No. 10-2020-7018121.

* cited by examiner

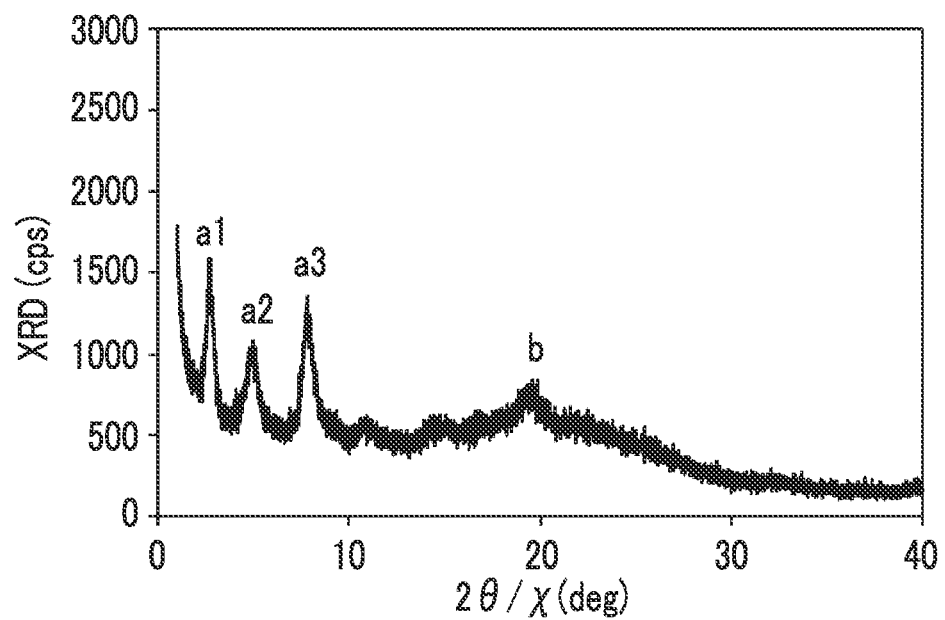

POLARIZER AND IMAGE DISPLAY DEVICE

CROSS-REFERENCE TO RELATED APPLICATIONS

This application is a Continuation of U.S. application Ser. No. 16/907,811, filed Jun. 22, 2020, which is a is a Continuation of PCT International Application No. PCT/JP2018/048530 filed on Dec. 28, 2018, which was published under PCT Article 21(2) in Japanese and which claims priority under 35 U.S.C. § 119(a) to Japanese Patent Application No. 2017-254571 filed on Dec. 28, 2017. The above applications are hereby expressly incorporated by reference, in their entirety, into the present application.

BACKGROUND OF THE INVENTION

1. Field of the Invention

The present invention relates to a polarizer and an image display device.

2. Description of the Related Art

In the related art, in a case where an attenuation function, a polarization function, a scattering function, a light shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode (OLED) to prevent reflection of external light.

In the related art, iodine has been widely used as a dichroic material in these polarizers, but a polarizer that uses an organic coloring agent in place of iodine as a dichroic material has also been examined.

For example, WO2017/154907A discloses a polarizer-forming composition which contains a polymer liquid crystal compound and a dichroic material.

SUMMARY OF THE INVENTION

As a result of preparation of a polarizer with reference to the examples of WO2017/154907A and evaluation of the degree of alignment thereof which are conducted by the present inventors under the above-described circumstance, it was clarified that further improvement of the degree of alignment is desirable in consideration of improvement of the performance of an image display device or the like expected in the future.

Further, in consideration of the above-described circumstances, an object of the present invention is to provide a polarizer with a high degree of alignment and an image display device including the polarizer.

As a result of intensive examination conducted by the present inventors in order to solve the above-described problems, it was found that (i) the degree of alignment is improved by using a crystalline polymer as a polymer liquid crystal compound, and (ii) the phenomenon of (i) occurs specifically in a case where a polymer liquid crystal compound and a dichroic material are horizontally aligned, thereby completing the present invention.

That is, the present inventors found that the above-described problems can be solved by employing the following configurations.

(1) A polarizer which is formed of a polarizer-forming composition containing a polymer liquid crystal compound and a dichroic material, in which the polymer liquid crystal compound is a thermotropic liquid crystal and a crystalline polymer, and the polymer liquid crystal compound and the dichroic material are horizontally aligned.

(2) The polarizer according to (1), in which a crystallization temperature of the polymer liquid crystal compound is 120° C. or lower.

(3) The polarizer according to (2), in which the crystallization temperature of the polymer liquid crystal compound is 95° C. or lower.

(4) The polarizer according to any one of (1) to (3), in which a crystallization temperature of the polarizer-forming composition is 100° C. or lower.

(5) The polarizer according to (4), in which the crystallization temperature of the polarizer-forming composition is 85° C. or lower.

(6) The polarizer according to any one of (1) to (5), in which a peak A with a half-width less than 2° and a peak B with a half-width of 2° or greater are observed in an X-ray diffraction spectrum.

(7) The polarizer according to (6), in which an intensity of the peak A is 500 cps or greater.

(8) The polarizer according to any one of (1) to (7), in which the polymer liquid crystal compound has a repeating unit represented by Formula (1).

(9) The polarizer according to (8), in which the mesogen group represented by M1 in Formula (1) contains three aromatic hydrocarbon groups.

(10) The polarizer according to (8) or (9), in which the spacer group represented by SP1 in Formula (1) is a group represented by *—$(CH_2—CH_2O)_3$—*, where a symbol * represents a bonding position with respect to L1 or M1 in Formula (1).

(11) The polarizer according to any one of (8) to (10), in which the terminal group represented by T1 in Formula (1) is a methoxy group.

(12) The polarizer according to any one of (8) to (11), in which the polymer liquid crystal compound has two kinds of repeating units represented by Formula (1), in one repeating unit, T1 in Formula (1) represents an alkoxy group, and in the other repeating unit, T1 in Formula (1) represents a group other than the alkoxy group.

(13) An image display device comprising: the polarizer according to any one of (1) to (12).

As described below, according to the present invention, it is possible to provide a polarizer with a high degree of alignment and an image display device including the polarizer.

BRIEF DESCRIPTION OF THE DRAWINGS

FIG. 1 shows an XRD spectrum of a polarizer according to one embodiment of the present invention using a polymer liquid crystal compound L1.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Respective components may be used alone or in combination of two or more kinds thereof. Here, in a case where two or more kinds of respective components are used in combination, the content of the components indicates the total content unless otherwise specified.

Further, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Polarizer]

The polarizer according to the embodiment of the present invention is a polarizer which is formed of a polarizer-forming composition containing a polymer liquid crystal compound and a dichroic material, in which the polymer liquid crystal compound is a thermotropic liquid crystal and a crystalline polymer, and the polymer liquid crystal compound and the dichroic material are horizontally aligned.

Since the polarizer according to the embodiment of the present invention has such a configuration, a high degree of alignment is considered to be exhibited.

As described above, a phenomenon in which the degree of alignment is improved in a case where a crystalline polymer is used as the polymer liquid crystal compound is a phenomenon occurring specifically in a case where the polymer liquid crystal compound and the dichroic material are horizontally aligned.

[Polarizer-Forming Composition]

The polarizer-forming composition used in the polarizer according to the embodiment of the present invention (hereinafter, also referred to as "the composition of the present invention") contains a polymer liquid crystal compound and a dichroic material. Here, the polymer liquid crystal compound is a thermotropic liquid crystal and a crystalline polymer at the same time.

The composition of the present invention may contain components other than the polymer liquid crystal compound and the dichroic material.

Hereinafter, each component will be described.

<Polymer Liquid Crystal Compound>

As described above, the composition of the present invention contains a polymer liquid crystal compound (hereinafter, also referred to as "specific compound") which is a thermotropic liquid crystal and a crystalline polymer.

(Thermotropic Liquid Crystal)

A thermotropic liquid crystal is a liquid crystal that shows transition to a liquid crystal phase due to a change in temperature.

The specific compound is a thermotropic liquid crystal and may exhibit any of a nematic phase and a smectic phase, but it is preferable that the specific compound exhibits at least the nematic phase from the viewpoint that the degree of alignment of the polarizer becomes higher, and haze is unlikely to be observed (haze is improved). Hereinafter, "the degree of alignment of the polarizer becomes higher, and haze is unlikely to be observed" will be also referred to as "the effects of the present invention become more excellent".

The temperature at which the nematic phase is exhibited is preferably in a range of room temperature (23° C.) to 450° C. from the viewpoint that the effects of the present invention become more excellent, and more preferably in a range of 50° C. to 400° C. from the viewpoint of handleability and manufacturing suitability.

(Crystalline Polymer)

A crystalline polymer is a polymer showing a transition to a crystal layer due to a change in temperature. The crystalline polymer may show a glass transition other than the transition to the crystal layer.

From the viewpoint that the effects of the present invention become more excellent, it is preferable that the specific compound is a polymer liquid crystal compound that shows a transition (may show a glass transition during the process) from a crystal phase to a liquid crystal phase in a case of being heated or a polymer liquid crystal compound that shows a transition (may show a glass transition during the process) to a crystal phase in a case of being heated to enter a liquid crystal state and then being cooled down.

The presence or absence of crystallinity of the polymer liquid crystal compound is evaluated as follows.

Two polarizers of an optical microscope (ECLIPSE E600 POL, manufactured by Nikon Corporation) are disposed so as to be orthogonal to each other, and a sample table is set between the two polarizers. Further, a small amount of the polymer liquid crystal compound is placed on slide glass, and the slide glass is set on a hot stage placed on the sample table. While the state of the sample is observed, the temperature of the hot stage is increased to a temperature at which the polymer liquid crystal compound exhibits liquid crystallinity, and the polymer liquid crystal compound is allowed to enter a liquid crystal state. After the polymer liquid crystal compound enters the liquid crystal state, the behavior of the liquid crystal phase transition is observed while the temperature of the hot stage is gradually lowered, and the temperature of the liquid crystal phase transition is recorded. In a case where the polymer liquid crystal compound exhibits a plurality of liquid crystal phases (for example, a nematic phase and a smectic phase), all the transition temperatures are also recorded.

Next, approximately 5 mg of a sample of the polymer liquid crystal compound is put into an aluminum pan, and the pan is covered and set on a differential scanning calorimeter (DSC) (an empty aluminum pan is used as a reference). The polymer liquid crystal compound measured in the above-described manner is heated to a temperature at which the compound exhibits a liquid crystal phase, and the temperature is maintained for 1 minute. Thereafter, the calorific value is measured while the temperature is lowered at a rate of 10° C./min. An exothermic peak is confirmed from the obtained calorific value spectrum. As a result, in a case where an exothermic peak is observed at a temperature other than the liquid crystal phase transition temperature, it can be said that the exothermic peak is a peak due to crystallization and the polymer liquid crystal compound has crystallinity.

Meanwhile, in a case where an exothermic peak is observed at a temperature other than the liquid crystal phase transition temperature, it can be said that the polymer liquid crystal compound does not have crystallinity.

The method of obtaining a crystalline polymer is not particularly limited, but as a specific example, a method of using a polymer liquid crystal compound that contains a repeating unit (1) described below is preferable, and a method of using a suitable form among polymer liquid crystal compounds having a repeating unit (1) described below is more preferable.

(Crystallization Temperature)

As described above, the specific compound is a crystallized polymer.

From the viewpoint that the effects of the present invention become more excellent, the crystallization temperature of the specific compound is preferably 0° C. or higher and lower than 150° C., more preferably 120° C. or lower, still more preferably 15° C. or higher and lower than 120° C., and particularly preferably 95° C. or lower. The crystallization temperature of the polymer liquid crystal compound is preferably lower than 150° C. from the viewpoint of reducing haze.

Further, the crystallization temperature is a temperature of an exothermic peak due to crystallization in the above-described DSC.

(Suitable Form)

From the viewpoint that the effects of the present invention become more excellent, it is preferable that the specific compound is a polymer liquid crystal compound having a repeating unit represented by Formula (1) (hereinafter, also referred to as a "repeating unit (1)").

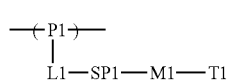

In Formula (1), P1 represents a main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

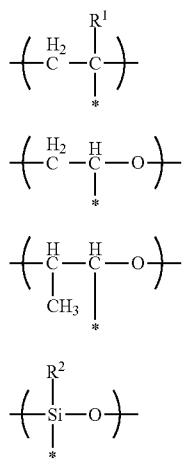

In Formulae (P1-A) to (P1-D), the symbol "*" represents a bonding position with respect to L1 in Formula (1). In Formula (P1-A), $R^1$ represents a hydrogen atom or a methyl group. In Formula (P1-D), $R^2$ represents an alkyl group.

From the viewpoint that the effects of the present invention become more excellent, it is preferable that the group represented by Formula (P1-A) is a unit of a partial structure of poly(meth)acrylic acid ester obtained by polymerization of (meth)acrylic acid ester.

From the viewpoint that the effects of the present invention become more excellent, it is preferable that the group represented by Formula (P1-B) is an ethylene glycol unit in polyethylene glycol obtained by polymerizing ethylene glycol.

From the viewpoint that the effects of the present invention become more excellent, it is preferable that the group represented by Formula (P1-C) is a propylene glycol unit obtained by polymerizing propylene glycol.

From the viewpoint that the effects of the present invention become more excellent, it is preferable that the group represented by Formula (P1-D) is preferably a siloxane unit of a polysiloxane obtained by polycondensation of a silanol.

L1 represents a single bond or a divalent linking group.

Examples of the divalent linking group represented by L1 include —C(O)O—, —OC(O)—, —O—, —S—, —C(O)NR$^3$—, —NR$^3$C(O)—, —SO$_2$— and —NR$^3$R$^4$—. In the formulae, $R^3$ and $R^4$ each independently represent a hydrogen atom or an alkyl group having 1 to 6 carbon atoms which may have a substituent (for example, a substituent W described below).

In a case where P1 represents a group represented by Formula (P1-A), from the viewpoint that the effects of the present invention become more excellent, it is preferable that L1 represents a group represented by —C(O)O—.

In a case where P1 represents a group represented by any of Formulae (P1-B) to (P1-D), from the viewpoint that the effects of the present invention become more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and the symbol "*" represents a bonding position with respect to L1 or M1 in Formula (1). From the viewpoint that the effects of the present invention become more excellent, n1 represents preferably an integer of 2 to 10, more preferably an integer of 2 to 4, and most preferably 3.

Further, from the viewpoint that the effects of the present invention become more excellent, a group represented by *—(CH(CH$_3$)—CH$_2$O)$_{n2}$—* is preferable as the oxypropylene structure represented by SP1. In the formula, n2 represents an integer of 1 to 3, and the symbol "*" represents a bonding position with respect to L1 or M1.

Further, from the viewpoint that the effects of the present invention become more excellent, a group represented by *—(Si(CH$_3$)$_2$—O)$_{n3}$—* is preferable as the polysiloxane structure represented by SP1. In the formula, n3 represents an integer of 6 to 10, and the symbol "*" represents a bonding position with respect to L1 or M1.

Further, from the viewpoint that the effects of the present invention become more excellent, a group represented by *—(CF$_2$—CF$_2$)$_{n4}$—* is preferable as the alkylene fluoride structure represented by SP1. In the formula, n4 represents an integer of 6 to 10, and the symbol "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and can refer to, for example, description on pages 7 to 16 of "Flussige Kristalle in Tabellen II" (VEB Deutsche Verlag fur Grundstoff Industrie, Leipzig, 1984) and the description in Chapter 3 of "Liquid Crystal Handbook" (Maruzen, 2000) edited by Liquid Crystals Handbook Editing Committee.

As the mesogen group, for example, a group having at least one cyclic structure selected from the group consisting of an aromatic hydrocarbon group, a heterocyclic group, and an alicyclic group is preferable.

From the viewpoint that the effects of the present invention become more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention become more excellent, as the mesogen group, a group represented by Formula (M1-A) or Formula (M1-B) is preferable, and a group represented by Formula (M1-B) is more preferable.

In Formula (M1-A), A1 represents a divalent group selected from the group consisting of an aromatic hydrocarbon group, a heterocyclic group, and an alicyclic group. These groups may be substituted with a substituent such as an alkyl group, a fluorinated alkyl group, an alkoxy group, or a substituent W described below.

The divalent group represented by A1 is preferably a 4- to 6-membered ring. Further, the divalent group represented by A1 may be a single ring or a fused ring.

The symbol "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

The atoms other than carbon constituting the divalent aromatic heterocyclic group include a nitrogen atom, a sulfur atom and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention become more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention become more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —N=N—, —S—, —S(O)—, —S(O)(O)—, —(O)S(O)O—, —O(O)S(O)O—, —SC(O)—, and —C(O)S—. Among these, from the viewpoint that the effects of the present invention become more excellent, —C(O)O— is preferable. LA1 may represent a group obtained by combining two or more of these groups.

Specific examples of M1 include the following structures. In the following specific examples, "Ac" represents an acetyl group.

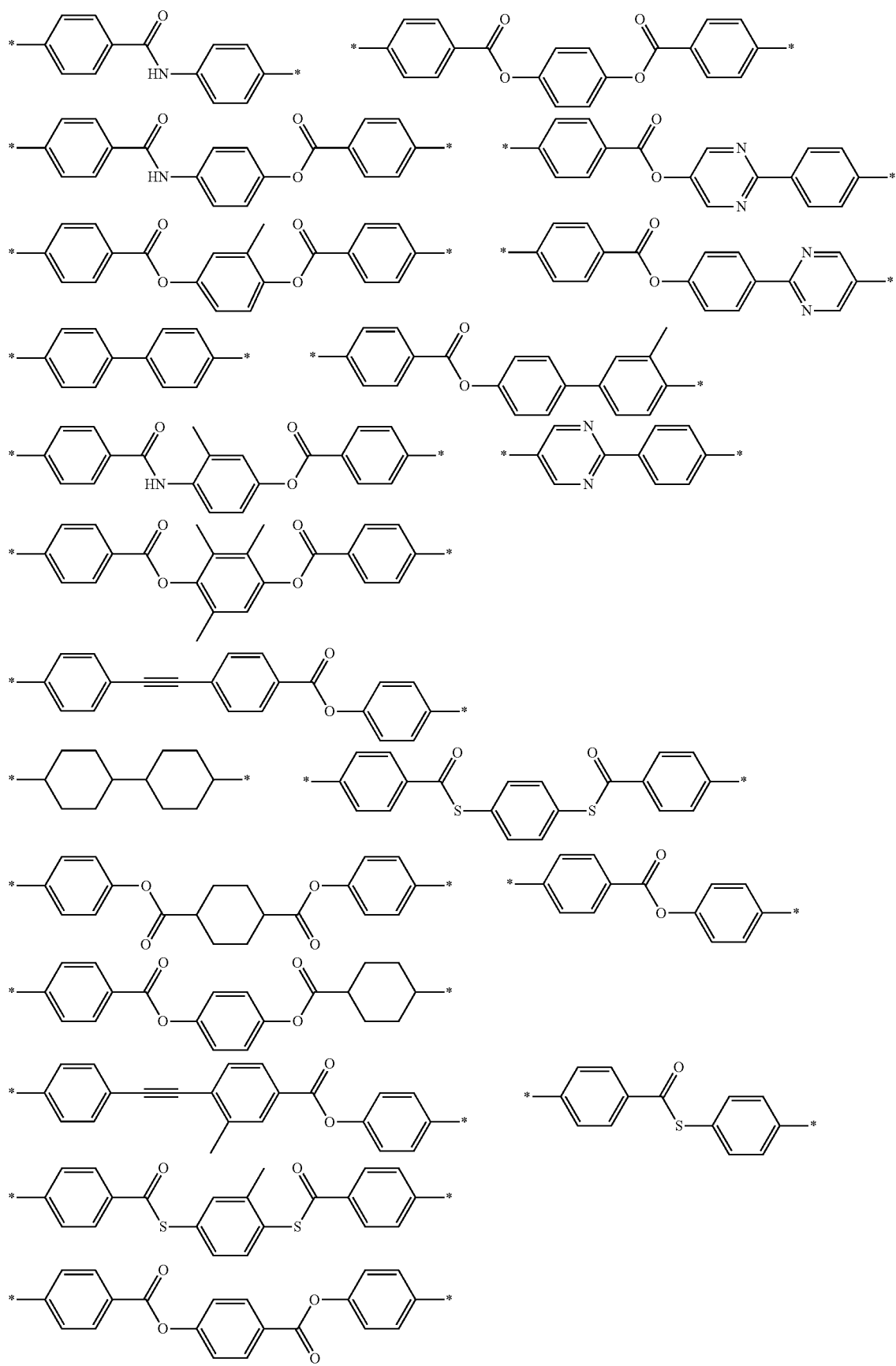

-continued
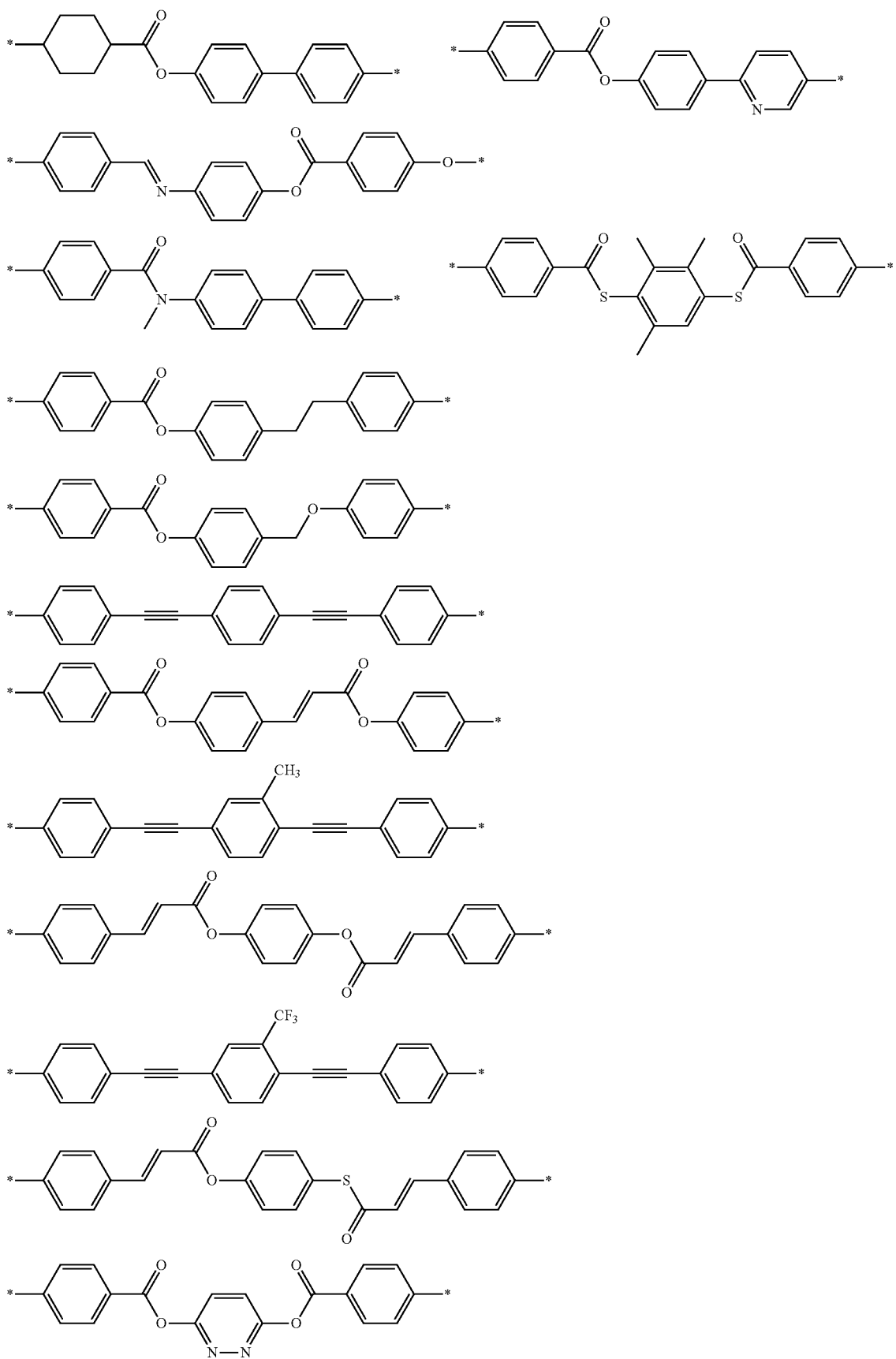

-continued
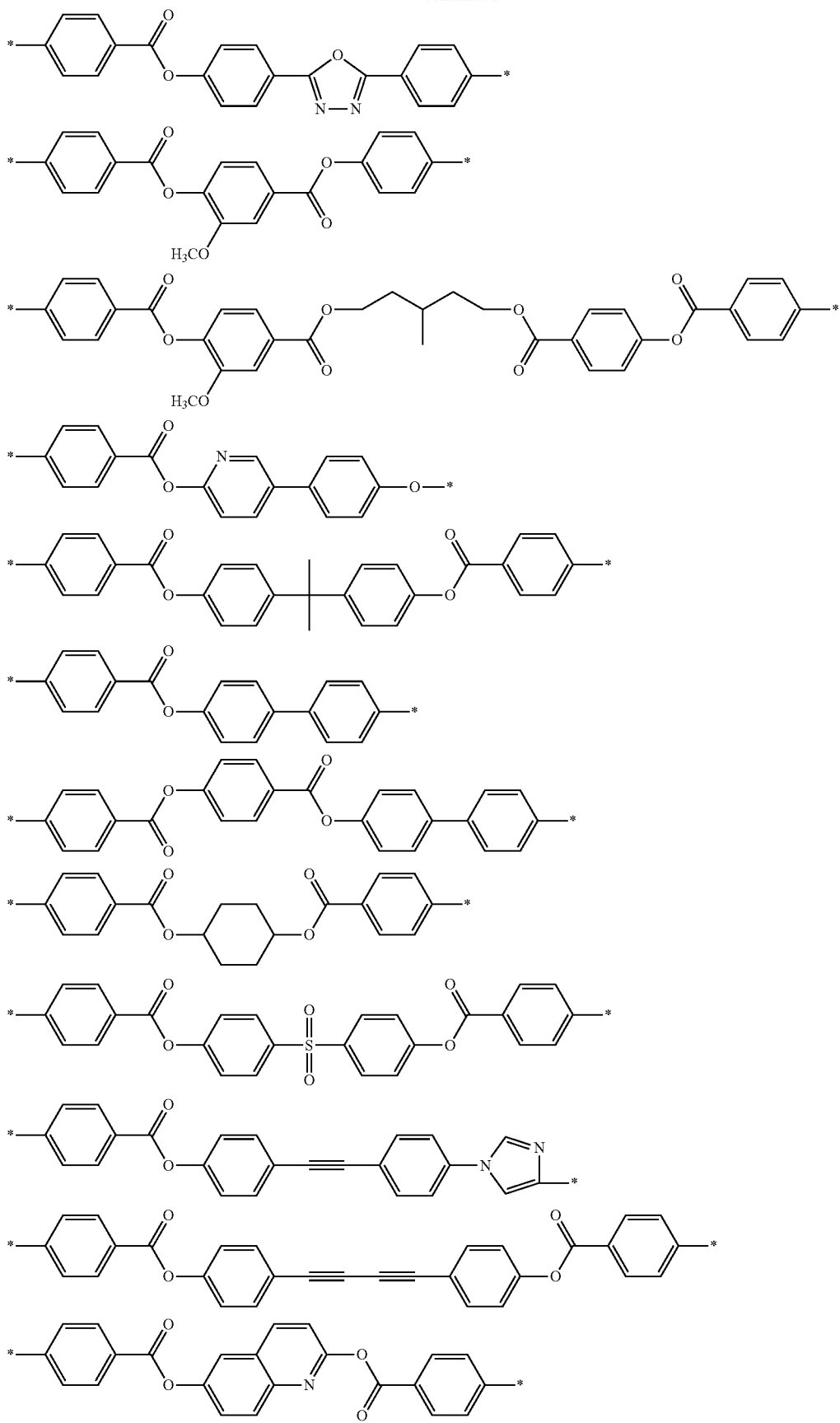

-continued
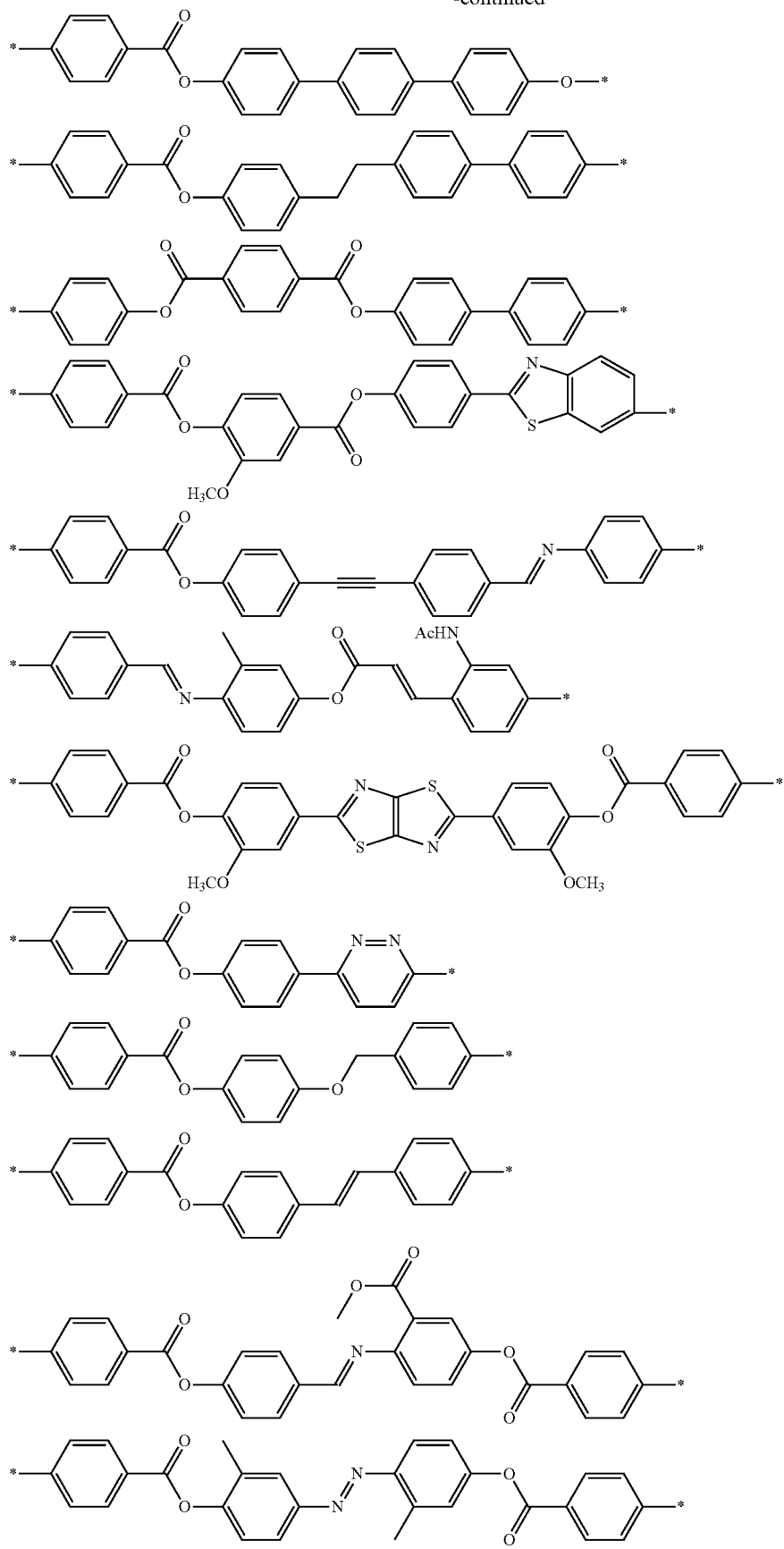

-continued

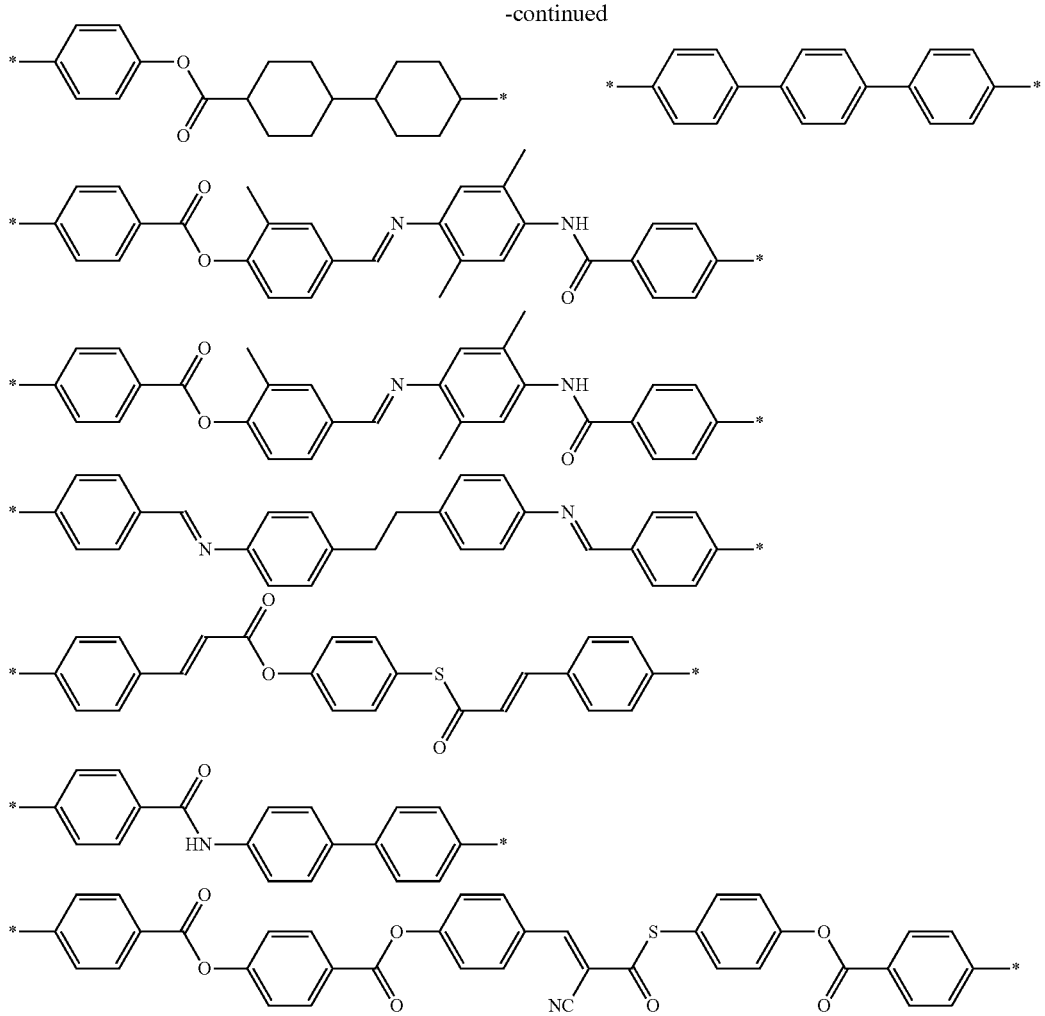

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group. Specific examples of the linking group are the same as those for L1 and SP1 described above, and A represents a (meth)acryloyloxy group).

From the viewpoint that the effects of the present invention become more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention become more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the polarizer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint that the effects of the present invention become more excellent, the content of the repeating unit (1) is preferably in a range of 20% to 100% by mass, more preferably in a range of 30% to 99.9% by mass, and still more preferably in a range of 40% to 99.0% by mass with respect to 100% by mass of all the repeating units in the specific compound.

In the present invention, the content of each repeating unit contained in the polymer liquid crystal compound is calculated based on the charged amount (mass) of each monomer used for obtaining each repeating unit.

The specific compound may have only one or two or more kinds of the repeating units (1). Among these, from the viewpoint that the effects of the present invention become more excellent, the specific compound may have two kinds of the repeating units (1).

In a case where the specific compound has two kinds of the repeating units (1), from the viewpoint that the effects of the present invention become more excellent, it is preferable that the terminal group represented by T1 in one (repeating unit A) is an alkoxy group and the terminal group represented by T1 in the other (repeating unit B) is a group other than the alkoxy group.

From the viewpoint that the effects of the present invention become more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the effects of the present invention become more excellent, the ratio (A/B) between the content of the repeating unit A in the specific compound and the content of the repeating unit B in the specific compound is preferably in a range of 50/50 to 95/5, more preferably in a range of 60/40 to 93/7, and still more preferably in a range of 70/30 to 90/10.

(Weight-Average Molecular Weight)

From the viewpoint that the effects of the present invention become more excellent, the weight-average molecular weight (Mw) of the specific compound is preferably in a range of 1000 to 500000 and more preferably in a range of 2000 to 300000. In a case where the Mw of the specific compound is in the above-described range, the specific compound is easily handled.

In particular, from the viewpoint of suppressing cracking during the coating, the weight-average molecular weight (Mw) of the specific compound is preferably 10000 or greater and more preferably in a range of 10000 to 300000.

In addition, from the viewpoint of the temperature latitude of the degree of alignment, the weight-average molecular weight (Mw) of the specific compound is preferably less than 10000 and more preferably 2000 or greater and less than 10000.

Here, the weight-average molecular weight and the number average molecular weight in the present invention are values measured according to gel permeation chromatography (GPC).

Solvent (eluent): N-methylpyrrolidone
Device name: TOSOHHLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

<Dichroic Material>

The dichroic material is not particularly limited, and examples thereof include a visible light absorbing material (dichroic coloring agent), a luminescent material (such as a fluorescent material or a phosphorescent material), an ultraviolet absorbing material, an infrared absorbing material, a nonlinear optical material, a carbon nanotube, and an inorganic material (for example, a quantum rod). Further, known dichroic materials (dichroic coloring agents) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [J0016] to [0018] of JP1999-305036A (JP-H11-305036), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO 2016/060173A, paragraphs [0008] to [0062] of WO 2016/136561A, paragraphs [0014] to [0033] of WO 2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more kinds of dichroic materials may be used in combination. For example, from the viewpoint of making the color of the polarizer closer to black, it is preferable that at least one dichroic material having a maximum absorption wavelength in a wavelength range of 370 to 550 nm and at least one dichroic material having a maximum absorption wavelength in a wavelength range of 500 to 700 nm are used in combination.

The dichroic material may contain a crosslinkable group.

Specific examples of the crosslinkable group include a (meth)acryloyl group, an epoxy group, an oxetanyl group, and a styryl group. Among these, a (meth)acryloyl group is preferable.

In the composition of the present invention, from the viewpoint that the effects of the present invention become more excellent, the content of the dichroic material is preferably in a range of 1 to 400 parts by mass, more preferably in a range of 2 to 100 parts by mass, and still more preferably in a range of 5 to 30 parts by mass with respect to 100 parts by mass of the specific compound.

<Solvent>

From the viewpoint of workability and the like, it is preferable that the composition of the present invention contains a solvent.

Examples of the solvent include ketones (such as acetone, 2-butanone, methyl isobutyl ketone, cyclopentanone, and cyclohexanone), ethers (such as dioxane, tetrahydrofuran, and cyclopentyl methyl ether), aliphatics hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, and butyl acetate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide and dimethylacetamide), organic solvents such as heterocyclic compounds (such as pyridine), and water. These solvents may be used alone or in combination of two or more kinds thereof.

Among these solvents, from the viewpoint that the effects of the present invention become more excellent, it is preferable to use an organic solvent and more preferable to use halogenated carbons or ketones.

In a case where the composition of the present invention contains a solvent, from the viewpoint that the effects of the present invention become more excellent, the content of the solvent is preferably in a range of 70% to 99.5% by mass, more preferably in a range of 80% to 99% by mass, and still more preferably in a range of 85% to 97% by mass with respect to the total mass of the composition of the present invention.

<Interface Modifier>

From the viewpoint that the effects of the present invention become more excellent, it is preferable that the composition of the present invention contains an interface modifier. In a case where the composition contains an interface modifier, the smoothness of the coated surface is improved, the degree of alignment is improved, and cissing and unevenness are suppressed so that the in-plane uniformity is expected to be improved.

As the interface modifier, interface modifiers that allow polymer liquid crystal compounds to be horizontally aligned are preferable, and compounds (horizontal alignment agents) described in paragraphs [0253] to [0293] of JP2011-237513A can be used. Further, fluorine (meth)acrylate-based polymers described in [0018] to [0043] of JP2007-272185A can also be used. Compounds other than the compounds described above may be used as the interface modifier.

In a case where the composition of the present invention contains an interface modifier, from the viewpoint that the effects of the present invention become more excellent, the content of the interface modifier is preferably in a range of 0.001 to 5 parts by mass and more preferably in a range of 0.01 to 3 parts by mass with respect to 100 parts by mass which is the total amount of the specific compound and the dichroic material in the composition.

<Polymerization Initiator>

From the viewpoint that the effects of the present invention become more excellent, it is preferable that the composition of the present invention contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-040799A (JP-S63-040799A), JP1993-029234A (JP-H05-029234A), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the composition of the present invention contains a polymerization initiator, from the viewpoint that the effects of the present invention become more excellent, the content of the polymerization initiator is preferably in a range of 0.01 to 30 parts by mass and more preferably in a range of 0.1 to 15 parts by mass with respect to 100 parts by mass which is the total amount of the specific compound and the dichroic material in the composition. The durability of the polarizer becomes excellent in a case where the content of the polymerization initiator is 0.01 parts by mass or greater, and the alignment of the polarizer becomes excellent in a case where the content of the polymerization initiator is 30 parts by mass or less.

<Crystallization Temperature>

From the viewpoint that the effects of the present invention become more excellent, the crystallization temperature of the composition of the present invention is preferably in a range of 0° C. to 100° C. and more preferably in a range of 15° C. to 85° C. In a case where the crystallization temperature of the composition of the present invention is lower than 0° C., a low-temperature device is required to crystallize the composition of the present invention. In a case where the temperature of the composition of the present invention is higher than 110° C., haze is likely to occur.

The crystallization temperature of the composition of the present invention is measured according to the same procedures as those for the crystallization temperature of the polymer liquid crystal compound described above except that the composition of the present invention is used in place of the polymer liquid crystal compound. The crystallization temperature of the above-described composition is considered to be the crystallization temperature of mixed crystals of the polymer liquid crystal compound and the dichroic material.

<Substituent W>

The substituent W in the present specification will be described.

Examples of the substituent W include a halogen atom, an alkyl group (such as a tert-butyl group) (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonium group, an acylamino group, an aminocarbonylamino group, an alkoxycarbonylamino group, an aryloxycarbonylamino group, a sulfamoylamino group, an allkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), and other known substituents.

The details of the substituent are described in paragraph [0023] of JP2007-234651A.

[Horizontal Alignment]

As described above, in the polarizer of the present invention, the specific compound and the dichroic material are horizontally aligned.

Here, the horizontal alignment indicates that the specific compound and the dichroic material are aligned to be parallel to the main surface of the polarizer, but these are not required to be strictly parallel, and the average tilt angle with the horizontal plane is less than ±10 degrees. Further, the tilt angle can be measured using AxoScan OPMF-1 (manufactured by Opto Science, Inc.).

Specifically, an extinction coefficient ko [λ] (in-plane direction) and an extinction coefficient ke [λ] (thickness direction) are calculated using AxoScan OPMF-1 (manufactured by Opto science, Inc.) by calculating the Mueller matrix of the polarizer at a wavelength 2 and at room temperature based on the polar angle measured for every 10° from −50° to 50°, removing the influence of the surface reflection, and fitting the result to the following theoretical formula in consideration of the Snell's formula and Fresnel's equations. Unless otherwise specified, the wavelength λ is 550 nm.

$$k=-\log(T)\times\lambda/(4\pi d)$$

Here, T represents the transmittance, and d represents the thickness of the polarizer.

By calculating the absorbance and the dichroic ratio in the in-plane direction and the thickness direction based on the calculated ko [λ] and ke [λ], it can be confirmed whether the specific compound and the dichroic material are horizontally aligned.

[X-Ray Diffraction Peak]

From the viewpoint that the effects of the present invention become more excellent, in the polarizer according to the embodiment of the present invention, a peak (peak A) with a half-width less than 2° and a peak (peak B) with a half-width of 2° or greater (halo) may be observed in the X-ray diffraction (XRD) spectrum.

The peak A is considered to be a peak derived from a crystal of a polymer liquid crystal compound, and the peak B is considered to be a peak derived from a thermotropic liquid crystal or the like.

From the viewpoint that the effects of the present invention become more excellent, the diffraction angle of the peak A is preferably less than 17°.

Further, from the viewpoint that the effects of the present invention become more excellent, the diffraction angle of the peak B is preferably 17° or greater.

From the viewpoint that the effects of the present invention become more excellent, the intensity of the peak A with respect to the baseline is preferably 100 or greater, more preferably 150 or greater, and still more preferably 200 or greater. The upper limit of the intensity of the peak A is not particularly limited, but is preferably 10000 or less, more preferably 7000 or less, and still more preferably 3000 or less from the viewpoint that the effects of the present invention become more excellent. Here, the unit of the peak intensity is cps (count per second).

The peak intensity is a difference between the baseline intensity and the peak top intensity.

The peak intensity in the XRD spectrum is acquired by performing X-ray diffraction analysis using an in-plane method. Hereinafter, the X-ray diffraction analysis performed using the in-plane method is also described as "in-plane XRD". The in-plane XRD is performed by irradiating the surface of the polarizer layer with X-rays using a thin film X-ray diffractometer under the following conditions.

Cu ray source (CuKα, output of 45 kV, 200 mA) to be used

X-ray incidence angle of 0.2°

Optical system to be used: parallel optical system (cross beam optics (CBO)) (parallel beam (PB))

Incident side, incident slit: 0.2 mm, incident parallel slit in-plane parallel slit collimator (PSC), 0.5 degrees (deg), longitudinal limit slit: 10 mm Light-receiving side, light-receiving slit: 20 mm, light-receiving parallel slit in-plane parallel slit analyzer (PSA), 0.5 deg Detector: HyPix3000 (OD mode), manufactured by Rigaku Corporation 2θχ/φ Scan, scan conditions: 0.008 degrees/step, 2.0 degrees/min in range of 1 to 40 degrees φ Scan, scan condition: 0.5 degree/step, 9.6 degree/min in range of −120 to 120 degrees The above-described conditions are set values in a thin film X-ray diffractometer. As the thin film X-ray diffractometer, a known device can be used. As the thin film X-ray diffractometer, SmartLab (manufactured by Rigaku Corporation) can be exemplified. In a case where a plurality of samples are compared to one another, samples having the same size are used as samples to be analyzed according to the in-plane XRD. Further, a direction in which the polymer liquid crystal and the dichroic material are aligned in a major axis direction is set as an azimuthal angle (φ) of 0°, and in-plane ΔXRD is performed in all directions for every 15°, and the orientation in the substrate plane where the peak intensity becomes the maximum is determined by φ scan performed with respect to the observed peak. As the peak A and the peak B described above, peaks of the in-plane XRD spectrum in the orientation obtained as described above are used. For the peak intensity, a value standardized as a film thickness corresponding to the X-ray penetration length at an X-ray incidence angle of 0.2° is used.

Further, the area for measuring the XRD spectrum is set to 30 mm×30 mm Hereinafter, the description will be made using the XRD spectrum in detail.

FIG. 1 is an XRD spectrum of the polarizer according to one embodiment of the present invention using a polymer liquid crystal compound L1 described below as the polymer liquid crystal compound.

All peaks a1 to a3 have a half-width less than 2° and correspond to the above-described peak A (which is considered to be a peak derived from a crystal). Further, the peak b has a half-width of 2° or greater and corresponds to the above-described peak B (halo) (which is considered to be a peak derived from a thermotropic liquid crystal).

[Thickness]

From the viewpoint that the effects of the present invention become more excellent, the film thickness of the polarizer according to the embodiment of the present invention is preferably in a range of 0.1 to 5.0 μm and more preferably in a range of 0.3 to 1.5 μm. Although it depends on the concentration of the dichroic material in the composition, a polarizer with an excellent absorbance is obtained in a case where the film thickness is 0.1 μm or greater, and a polarizer with an excellent transmittance is obtained in a case where the film thickness is 5.0 μm or less.

[Method of Producing Polarizer]

The method of producing the polarizer according to the embodiment of the present invention is not particularly limited, but a method comprising a step of coating an alignment film with the above-described composition of the present invention to form a coating film (hereinafter, also referred to as a "coating film forming step") and a step of aligning a dichroic material contained in the coating film (hereinafter, also referred to as an "aligning step") in this order (hereinafter, also referred to as the "method of the present invention") is preferable from the viewpoint that the degree of alignment of the polarizer to be obtained becomes higher and the haze is unlikely to be observed. Hereinafter, "the degree of alignment of the polarizer to be obtained becomes higher and haze is unlikely to be observed" will also be referred to as "the effects of the present invention become more excellent".

Hereinafter, each step will be described.

<Coating Film Forming Step>

The coating film forming step is a step of coating the alignment film with the above-described composition of the present invention to form a coating film. The specific compound in the coating film is horizontally aligned due to an interaction between the alignment film and an interface modifier (in a case where the composition of the present invention contains an interface modifier).

The alignment film can be easily coated with the composition of the present invention by using the composition of the present invention which contains the above-described solvent or using a liquid such as a melt obtained by heating the composition of the present invention.

Examples of the method of coating the film with the composition of the present invention include known methods such as a roll coating method, a gravure printing method, a spin coating method, a wire bar coating method, an extrusion coating method, a direct gravure coating method, a reverse gravure coating method, a die coating method, a spraying method, and an inkjet method.

(Alignment Film)

An alignment film may be any film as long as the film allows the specific compound contained in the composition of the present invention to be horizontally aligned.

An alignment film can be provided by means such as a rubbing treatment performed on a film surface of an organic compound (preferably a polymer), oblique deposition of an inorganic compound, formation of a layer having microgrooves, or accumulation of an organic compound (such as w-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In this specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic polarizing plate, or a wire grid polarizing plate), a method of using a prism-based element (for example, a Glan-Thompson prism) or a reflective polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0 to 90° (vertical) and more preferably in a range of 40 to 90°.

In a case where light to be applied is non-polarized light, the alignment film is irradiated with non-polarized light obliquely. The incidence angle is preferably in a range of 10 to 80°, more preferably in a range of 20 to 60°, and still more preferably in a range of 30 to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of aligning the dichroic material contained in the coating film. In this manner, the polarizer according to the embodiment of the present invention is obtained. In the aligning step, the dichroic material is considered to be aligned along the specific compound aligned by the alignment film.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the dichroic material contained in the composition of the present invention may be aligned by performing the above-described coating film forming step or drying treatment. For example, in a form in which the composition of the present invention is prepared as a coating solution containing a solvent, the polarizer according to the embodiment of the present invention may be obtained by drying the coating film and removing the solvent from the coating film so that the dichroic material contained in the coating film is aligned.

It is preferable that the aligning step includes a heat treatment. In this manner, the dichroic material contained in the coating film is further aligned, and the degree of alignment of the polarizer to be obtained becomes higher.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the dichroic material contained in the coating film is further fixed, and the degree of alignment of the polarizer to be obtained is further increased. The cooling unit is not particularly limited and the cooling can be performed according to a known method.

The polarizer according to the embodiment of the present invention can be obtained by performing the above-described steps.

<Other Steps>

The method of the present invention may include a step of curing the polarizer after the aligning step (hereinafter, also referred to as a "curing step").

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate of the present invention includes a base material, an alignment film provided on the base material, and the above-described polarizer according to the embodiment of the present invention provided on the alignment film.

Further, the laminate of the present invention may include a $\lambda/4$ plate on the polarizer according to the embodiment of the present invention.

Further, the laminate of the present invention may include a barrier layer between the polarizer according to the embodiment of the present invention and the $\lambda/4$ plate.

Hereinafter, each layer constituting the laminate of the present invention will be described.

[Base Material]

The base material can be appropriately selected, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph [0013] of JP2002-022942A can be applied. Further, even in a case of a polymer easily exhibiting the birefringence such as polycarbonate and polysulfone which has been known in the related art, a polymer with the exhibiting property which has been reduced by modifying the molecules described in WO2000/26705A can be used.

[Alignment Film]

The alignment film is as described above, and thus the description thereof will not be repeated.

[Polarizer]

The polarizer according to the embodiment of the present invention is as described above, and thus the description will not be repeated.

[$\lambda/4$ Plate]

A "$\lambda/4$ plate" is a plate having a $\lambda/4$ function, specifically, a plate having a function of converting linearly polarized light having a specific wavelength into circularly polarized light (or converting circularly polarized light into linearly polarized light).

For example, specific examples of a form in which a $\lambda/4$ plate has a single-layer structure include a stretched polymer film and a phase difference film in which an optically anisotropic layer having a $\lambda/4$ function is provided on a support. Further, specific examples of a form in which a $\lambda/4$ plate has a multilayer structure include a broadband $\lambda/4$ plate obtained by laminating a $\lambda/4$ plate and a $\lambda/2$ plate.

The $\lambda/4$ plate and the polarizer according to the embodiment of the present invention may be provided by coming into contact with each other, or another layer may be provided between the $\lambda/4$ plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate of the present invention comprises a barrier layer, the barrier layer is provided between the polarizer according to the embodiment of the present invention and the $\lambda/4$ plate. Further, in a case where a layer other than the barrier layer (for example, a pressure sensitive adhesive layer or an adhesive layer) is comprised between the polarizer according to the embodiment of the present invention and the $\lambda/4$ plate, the barrier layer can be provided, for example, between the polarizer according to the embodiment of the present invention and the layer other than the barrier layer.

The barrier layer is also referred to as a gas barrier layer (oxygen barrier layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate of the present invention can be used as a polarizing element (polarizing plate) or the like, for example, as a linear polarizing plate or a circularly polarizing plate.

In a case where the laminate of the present invention does not include an optically anisotropic layer such as the 214 plate, the laminate can be used as a linear polarizing plate.

Meanwhile, in a case where the laminate of the present invention includes the 214 plate, the laminate can be used as a circularly polarizing plate.

[Image Display Device]

An image display device according to the embodiment of the present invention includes the above-described polarizer according to the embodiment of the present invention or the above-described laminate of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device of the embodiment of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate of the present invention (here, the laminate does not include a λ/4 plate) and a liquid crystal cell is more suitable.

In the present invention, between the polarizing elements provided on both sides of the liquid crystal cell, it is preferable that the laminate of the present invention is used as a front-side polarizing element and more preferable that the laminate of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystalline molecules are substantially horizontally aligned in a case of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystalline molecules are substantially vertically aligned in the case of no voltage application. The concept of the liquid crystal cell in a VA mode includes (1) a liquid crystal cell in a VA mode in a narrow sense where rod-like liquid crystal molecules are aligned substantially vertically in the case of no voltage application and substantially horizontally in a case of voltage application (described in JP1992-176625A (JP-H02-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned in the case of no voltage application and twistedly multi-domain aligned in the case of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, and a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-054982A (JP-H10-054982), JP1999-202323A (JP-H11-202323), JP1998-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Synthesis Example

[Polymer Liquid Crystal Compound]
<Polymer Liquid Crystal Compound L1>
The polymer liquid crystal compound L1 was prepared by the following procedures.
(Synthesis of Compound L1-2)

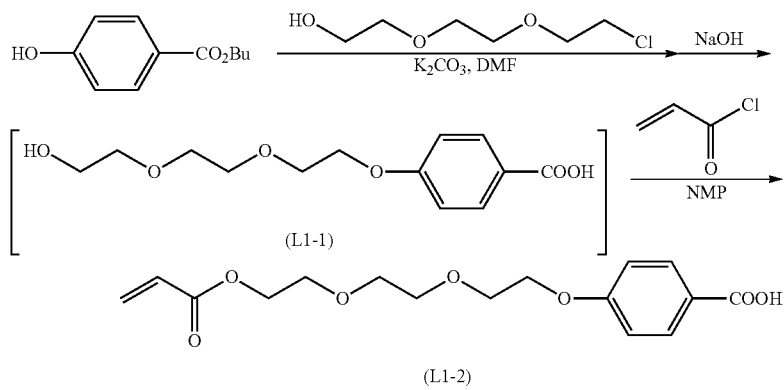

2-chloroethoxyethoxyethanol (244 g) and potassium carbonate (200 g) were added to a solution of butylparaben (201 g) in N,N-dimethylformamide (300 mL). The solution was stirred at 95° C. for 9 hours, toluene (262 mL) and water (660 mL) were added thereto, and concentrated hydrochloric acid (147 g) was added dropwise thereto. The reaction solution was stirred for 10 minutes, allowed to stand, and washed by performing a liquid separation operation. A 28 wt % (28 mass %) sodium methoxide methanol solution (500 g) and water (402 mL) were added to the obtained organic layer, and the solution was stirred at 50° C. for 2 hours. Thereafter, the organic solvent was distilled off by concentration, water (402 mL) was added thereto, and the solution was concentrated again at 50° C. until the weight thereof reached 1.13 kg. Water (478 mL) was added to the obtained solution, and concentrated hydrochloric acid (278 g) was added dropwise thereto. Ethyl acetate (1.45 kg) was added thereto, and the solution was stirred at 30° C. for 10 minutes, and the aqueous layer was removed by performing the liquid separation operation. Next, a 20 wt % saline solution (960 mL) was added thereto, the solution was stirred at 30° C. for 10 minutes, and the aqueous layer was removed by performing the liquid separation operation. N-methylpyrrolidone (824 g) was added to the obtained organic layer, and a concentration operation was performed thereon at 70° C. for 4 hours to obtain 1.13 kg of a N-methylpyrrolidone solution containing the compound (L1-1). The next step was performed using 1085 g of the obtained N-methylpyrrolidone solution containing the obtained compound (L1-1). N,N-dimethylaniline (189 g) and 2,2,6,6-tetramethylpiperazine (1.5 g) were added to the obtained N-methylpyrrolidone solution (1085 g) containing the obtained compound (L1-1), the internal temperature was lowered, and acrylic acid chloride (122 g) was added dropwise thereto such that the internal temperature did not rise above 10° C. The solution was stirred at an internal temperature of 10° C. for 2 hours, methanol (81 g) was added dropwise thereto, and the resulting solution was stirred for 30 minutes. Ethyl acetate (1.66 kg), 10 wt % saline (700 mL), and 1N aqueous hydrochloric acid (840 mL) were added thereto, and the aqueous layer was removed by performing the liquid separation operation. Next, a 10 wt % saline solution (800 mL) was added thereto, the solution was stirred at 30° C. for 10 minutes, and the aqueous layer was removed by performing the liquid separation operation. Next, a 20 wt % saline solution (800 mL) was added thereto, the solution was stirred at 30° C. for 10 minutes, and the aqueous layer was removed by performing the liquid separation operation. A mixed solvent of hexane/isopropyl alcohol (1780 mL/900 mL) was added to the obtained organic layer, and the solution was cooled to 5° C., stirred for 30 minutes, and then filtered, thereby obtaining 209 g of a white solid compound (L1-2) (3 steps, yield of 65%).

$^1$H-NMR (solvent: CDCl$_3$) δ (ppm): 3.67-3.78 (m, 6H), 3.87-3.92 (m, 2H), 4.18-4.23 (m, 2H), 4.31-4.35 (m, 2H), 5.80-5.85 (m, 1H), 6.11-6.19 (m, 1H), 6.40-6.46 (m, 1H), 6.93-6.98 (m, 2H), 8.02-8.07 (m, 2H)

(Synthesis of Compound L1-3)

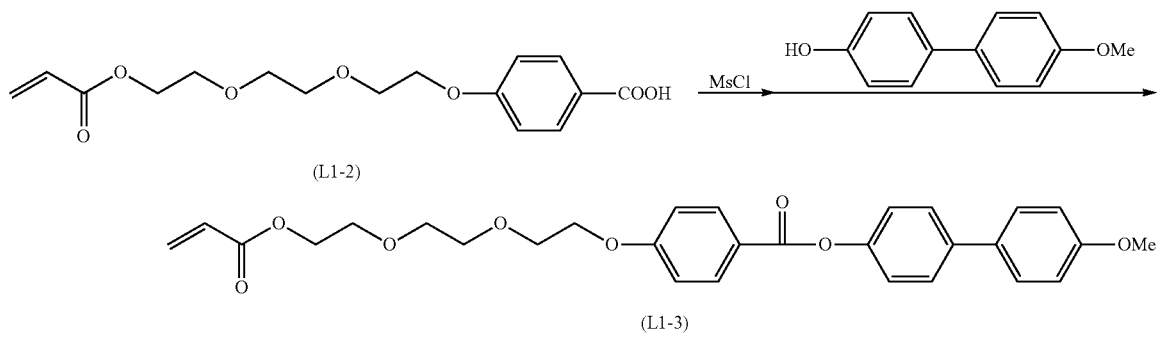

Dibutylhydroxytoluene (BHT) (200 mg) was added to a solution of methanesulfonyl chloride (MsCl) (73.4 mmol, 5.7 mL) in tetrahydrofuran (THF) (70 mL), and the internal temperature thereof was lowered to −5° C. A THF solution of the compound (L1-2) (66.7 mmol, 21.6 g) and diisopropylethylamine (DIPEA) (75.6 mmol, 13.0 mL) was added dropwise thereto such that the internal temperature thereof did not rise above 0° C. or higher. The solution was stirred at −5° C. for 30 minutes, N,N-dimethyl-4-aminopyridine (DMAP) (200 mg) was added thereto, and a solution of diisopropylethylamine (75.6 mmol, 13.0 mL) and 4-hydroxy-4'-methoxy biphenyl (60.6 mmol, 12.1 g) in tetrahydrofuran (THF) and dimethylacetamide (DMAc) was added dropwise thereto such that the internal temperature thereof did not rise above 0° C. or higher. Thereafter, the solution was stirred at room temperature for 4 hours. The reaction was stopped by adding methanol (5 mL) to the solution, water and ethyl acetate were added thereto. The solvent was removed from the organic layer extracted with ethyl acetate using a rotary evaporator, and the organic layer was purified by column chromatography using ethyl acetate and hexane, thereby obtaining 18.7 g (yield: 61%) of a compound (L1-3) as a white solid. In the structural formula, Me represents a methyl group.

$^1$H-NMR (solvent: CDCl$_3$) δ (ppm): 3.65-3.82 (m, 6H), 3.85 (s, 3H), 3.85-3.95 (m, 2H), 4.18-4.28 (m, 2H), 4.28-4.40 (m, 2H), 5.82 (dd, 1H), 6.15 (dd, 1H), 6.43 (dd, 1H), 6.90-7.05 (m, 4H), 7.20-7.30 (m, 2H), 7.45-7.65 (m, 4H), 8.10-8.20 (m, 2H)

The following compound (L1-b) was contained as an impurity.

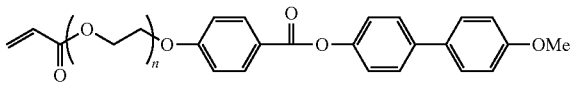

n represents an integer other than 3 (L1-b
(Synthesis of Compound L1-23)

Methyl 4-(4-hydroxyphenyl) benzoate was synthesized according to the method described in Journal of Polymer Science, Part A: Polymer Chemistry, 2012, vol. 50, p. 3936 to 3943.

2,2,6,6-Tetramethylpiperidine 1-oxyl (68 mg) was added to a solution of methanesulfonyl chloride (MsCl) (54.8 mmol, 6.27 g) in ethyl acetate (44 mL), and the internal temperature thereof was lowered to −5° C. A THF solution of the compound (L1-2) (52.6 mmol, 17.1 g) synthesized in the above-described manner and diisopropylethylamine (DIPEA) (57.0 mol, 7.36 g) was added dropwise thereto such that the internal temperature thereof did not rise above 0° C. or higher. The solution was stirred at −5° C. for 30 minutes, a solution of methyl 4-(4-hydroxyphenyl) benzoate (43.8 mmol, 10.0 g) in DMAc and N-methyl-imidazole (NMI) (1.8 g) were added thereto, and diisopropylethylamine (75.6 mmol, 13.0 mL) was added dropwise thereto such that the internal temperature thereof did not rise above 0° C. or higher. Thereafter, the solution was stirred at room temperature for 4 hours. The reaction was stopped by adding water and ethyl acetate to the solution. Liquid separation was performed so that the solvent was removed from the organic layer extracted with ethyl acetate using a rotary evaporator, and the organic layer was purified by column chromatography using ethyl acetate and hexane, thereby obtaining 20.4 g (yield of 87%) of a compound (L1-23) as a white solid.

$^1$H-NMR (solvent: CDCl$_3$) δ (ppm): 3.68-3.80 (m, 6H), 3.87-3.95 (m, 2H), 3.95 (s, 3H), 4.20-4.27 (m, 2H), 4.31-4.37 (m, 2H), 5.83 (dd, 1H), 6.16 (dd, 1H), 6.43 (dd, 1H), 6.97-7.05 (m, 2H), 7.28-7.35 (m, 2H), 7.64-7.72 (m, 4H), 8.08-8.20 (m, 4H)

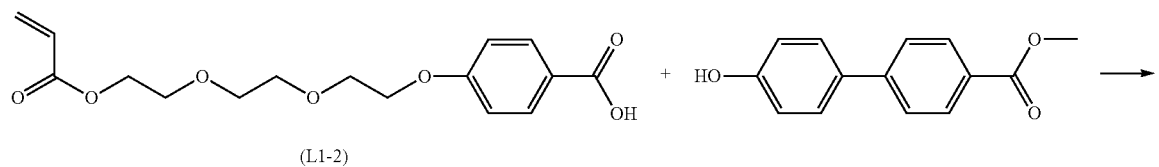

(L1-2)

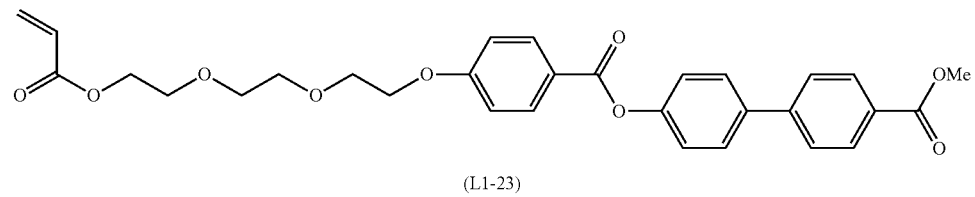

(L1-23)

The following compound (L1-b2) was contained as an impurity.

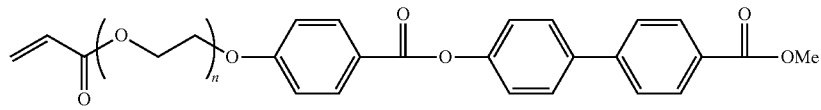

n represents an integer other than 3 (L1-2b)

(Synthesis of Polymer Liquid Crystal Compound L1)

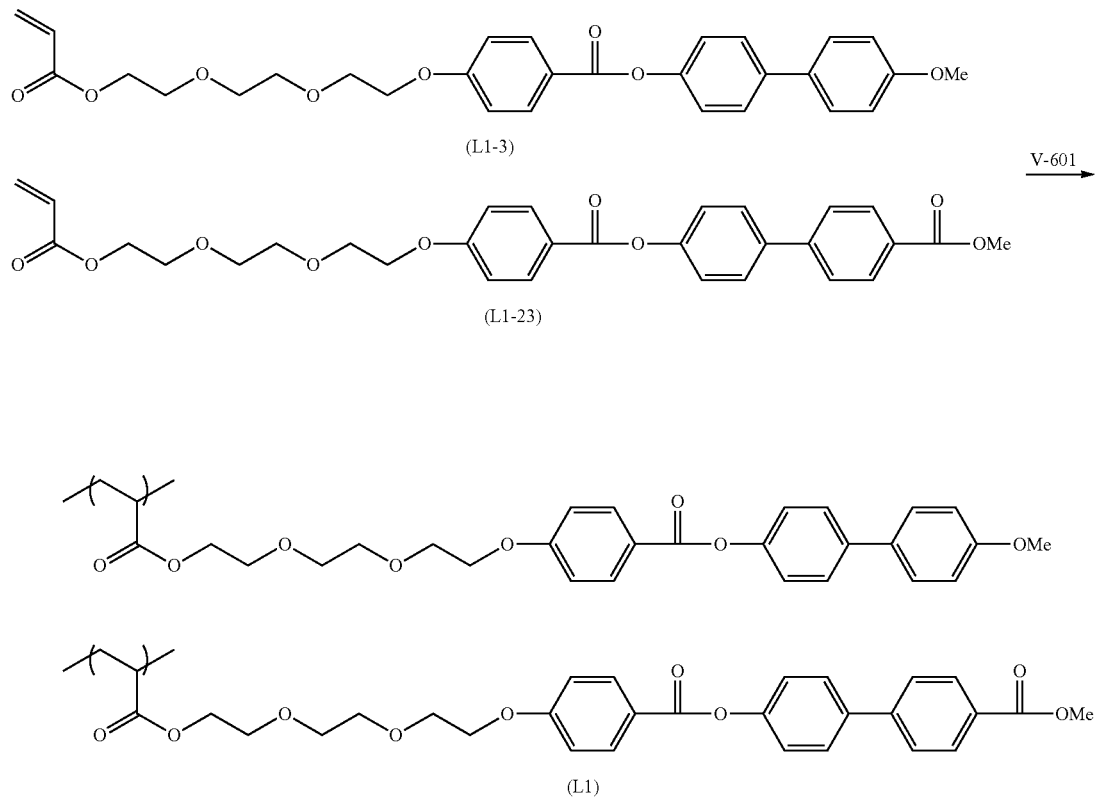

The compound (L1-3) (84 g), the compound (L1-23) (21 g), and dibutylhydroxytoluene (BHT) (158 mg) were dissolved in anisole (337 g). Dimethyl 2,2'-azobis(2-methylpropionate) (1660 mg) (trade name "V-601") was added thereto at room temperature, and the solution was stirred. The obtained anisole solution was added dropwise to anisole (84 g) heated to 80° C. in a nitrogen atmosphere for 2 hours, and the resulting solution was stirred at 80° C. for 4 hours after the dropwise addition. The obtained reaction solution was added dropwise to methanol (1080 mL), and the precipitate was collected by filtration, and the residue was washed with acetonitrile, thereby obtaining 100 g (yield 95%) of a compound (L1) as a white solid. The weight-average molecular weight (Mw) of the obtained polymer was 13300.

Further, the molecular weight was calculated by gel permeation chromatography (GPC) in terms of polystyrene, three of TOSOH TSKgel Super AWM-H (manufactured by Tosoh Corporation) were connected to each other and used as columns, and N-methylpyrrolidone was used as a solvent.

<Polymer Liquid Crystal Compound L2>

According to the following steps 1 and 2, a polymer liquid crystal compound L2 was synthesized.

(Step 1)

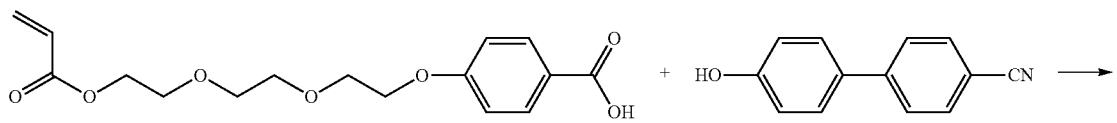

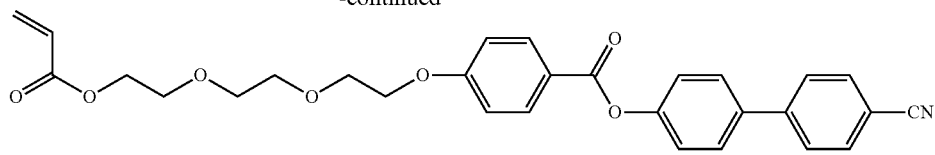

P14-A 2,2,6,6-Tetramethylpiperidine 1-oxyl (68 mg) was added to a solution of methanesulfonyl chloride (MsCl) (54.8 mmol, 6.27 g) in ethyl acetate (44 mL), and the internal temperature thereof was lowered to −5° C. A THF solution of the compound (P1-1) (52.6 mmol, 17.1 g) synthesized in the above-described manner and diisopropylethylamine (DIPEA) (57.0 mol, 7.36 g) was added dropwise thereto such that the internal temperature thereof did not rise above 0° C. or higher. The solution was stirred at −5° C. for 30 minutes, a DMAc solution of 4-cyano-4'-hydroxybiphenyl (43.8 mmol, 8.55 g) and N-methyl-imidazole (NMI) (1.8 g) were added thereto, and diisopropylethylamine (75.6 mmol, 13.0 mL) was added dropwise thereto such that the internal temperature did not rise above 0° C. or higher. Thereafter, the solution was stirred at room temperature for 4 hours. The reaction was stopped by adding water and ethyl acetate to the solution. Liquid separation was performed so that the solvent was removed from the organic layer extracted with ethyl acetate using a rotary evaporator, and the organic layer was purified by column chromatography using ethyl acetate and hexane, thereby obtaining 19.0 g (yield of 87%) of a compound (P14-A) as a white solid.

$^1$H-NMR (solvent: CDCl$_3$) δ (ppm): 3.68-3.80 (m, 6H), 3.87-3.95 (m, 2H), 4.20-4.27 (m, 2H), 4.32-4.37 (m, 2H), 5.84 (dd, 1H), 6.16 (dd, 1H), 6.43 (dd, 1H), 6.98-7.05 (m, 2H), 7.30-7.37 (m, 2H), 7.60-7.78 (m, 6H), 8.13-8.20 (m, 2H)

(Step 2)

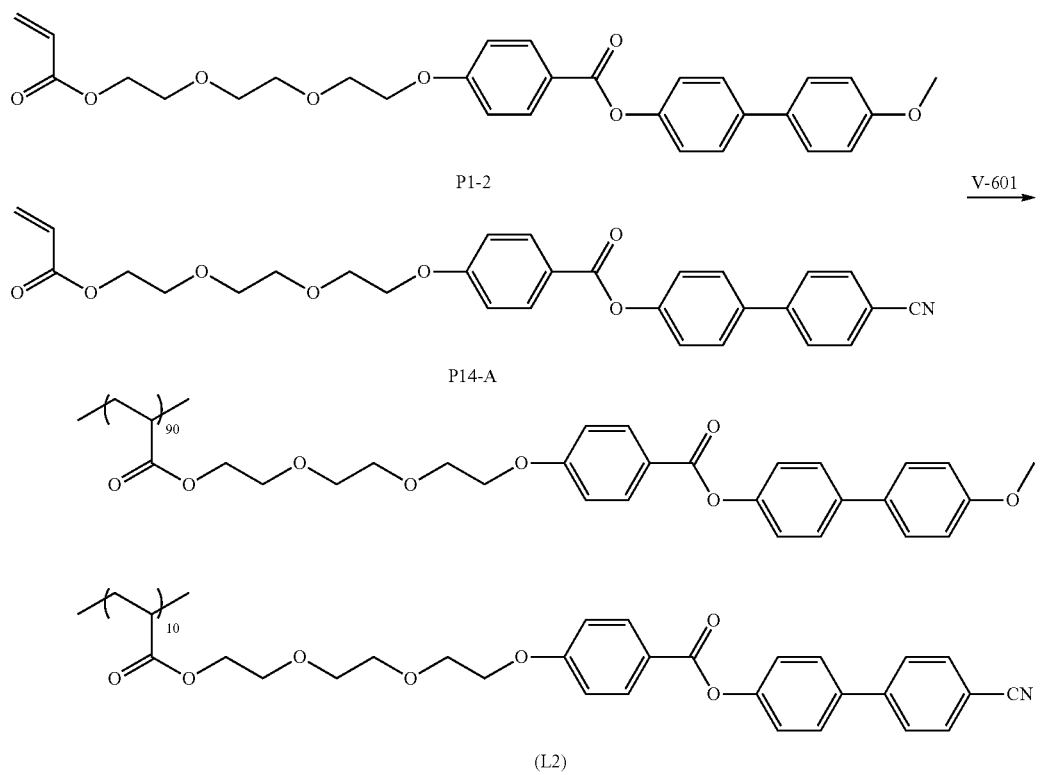

A DMAc solution (3.3 mL) of the compound P1-2 (0.9 g) and the compound P14-A (0.1 g) synthesized as described below was heated to an internal temperature of 80° C. in a nitrogen stream. A DMAc solution (0.5 mL) of dimethyl 2,2'-azobis(2-methylpropionate) (0.054 mmol, 0.012 g) (trade name "V-601", manufactured by Wako Pure Chemical Industries, Ltd.) was added thereto, and the solution was stirred at 80° C. for 2 hours. Thereafter, elimination of the polymerizable group was confirmed by $^1$H-NMR spectrum measurement, and the solution was cooled to room temperature. Methanol was added thereto to perform filtration, and the residue was washed with methanol, thereby obtaining 0.96 g of a compound (L2) as a white solid. As a result of analysis of the obtained polymer liquid crystal compound L2 by gel permeation chromatography (GPC), the weight-average molecular weight (Mw) thereof was 14000 (in terms of polystyrene).

<Polymer Liquid Crystal Compound L3>

A polymer liquid crystal compound L3 was synthesized as follows.

(Synthesis of P1-1)

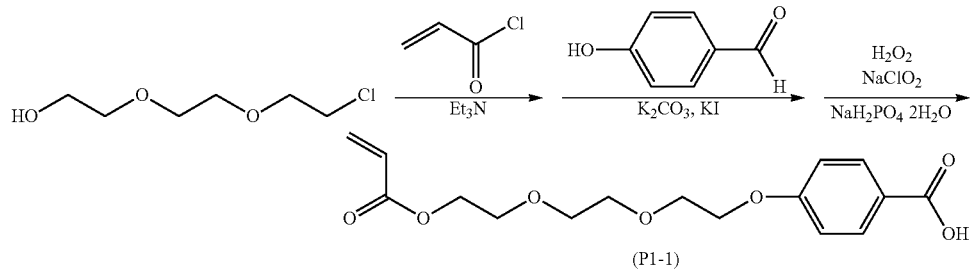

Dibutylhydroxytoluene (BHT) (100 mg) was added to a solution (60 mL) of 2-chloroethoxyethoxyethanol (14.05 g) in dimethylacetamide (DMAc), and acrylic acid chloride (7.54 g) and triethylamine (8.89 g) were added dropwise thereto under ice-cooling. The reaction solution was stirred for 1 hour and filtered. Next, potassium carbonate (15.7 g), potassium iodide (0.57 g), p-hydroxybenzaldehyde (9.25 g), and dibutylhydroxytoluene (BHT) (100 mg) were added thereto, and the solution was stirred at 110° C. for 4 hours, ethyl acetate and water were added thereto, and the reaction solution was washed by performing the liquid separation operation. Further, the reaction solution was concentrated using an evaporator, the temperature was returned to room temperature, a phosphate buffer solution obtained by dissolving 25 mL of acetonitrile and 2.36 g of a sodium dihydrogen phosphate dihydrate in 8 mL of water, and 11.2 mL of a hydrogen peroxide solution (30% by mass) were added thereto, and 33.4 g of a 25 mass % sodium chlorite aqueous solution was added thereto. The resulting solution was stirred at room temperature for 6 hours and allowed to stand for 8 hours, water was added thereto, and the obtained precipitate was collected, thereby obtaining 16.9 g (yield of 69%) of a compound (P1-1) as a white solid.

(Synthesis of P1-2)

Dibutylhydroxytoluene (BHT) (200 mg) was added to a solution of methanesulfonyl chloride (MsCl) (73.4 mmol, 5.7 mL) in tetrahydrofuran (THF) (70 mL), and the internal temperature thereof was lowered to −5° C. A THF solution of the compound (P1-1) (66.7 mmol, 21.6 g) and diisopropylethylamine (DIPEA) (75.6 mmol, 13.0 mL) was added dropwise such that the internal temperature thereof did not rise above 0° C. or higher. The solution was stirred at −5° C. for 30 minutes, N,N-dimethyl-4-aminopyridine (DMAP) (200 mg) was added thereto, and a solution of diisopropylethylamine (75.6 mmol, 13.0 mL) and 4-hydroxy-4'-methoxy biphenyl (60.6 mmol, 12.1 g) in tetrahydrofuran (THF) and dimethylacetamide (DMAc) was added dropwise thereto such that the internal temperature thereof did not rise above 0° C. or higher. Thereafter, the solution was stirred at room temperature for 4 hours. The reaction was stopped by adding methanol (5 mL) to the solution, water and ethyl acetate were added thereto. The solvent was removed from the organic layer extracted with ethyl acetate using a rotary evaporator, and the organic layer was purified by column chromatography using ethyl acetate and hexane, thereby obtaining 18.7 g (yield of 61%) of a compound (P1-2) as a white solid.

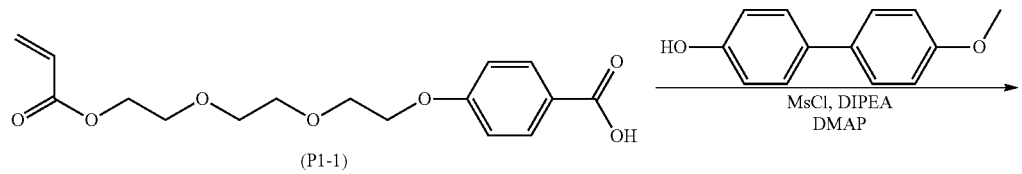

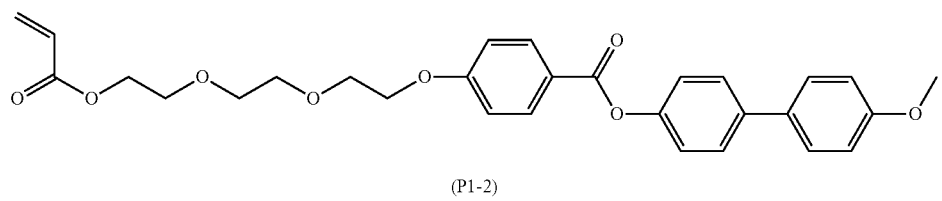

¹H-NMR (Nuclear Magnetic Resonance) (solvent: CDCl₃) δ (ppm): 3.65-3.82 (m, 6H), 3.85 (s, 3H), 3.85-3.95 (m, 2H), 4.18-4.28 (m, 2H), 4.28-4.40 (m, 2H), 5.82 (dd, 1H), 6.15 (dd, 1H), 6.43 (Dd, 1H), 6.90-7.05 (m, 4H), 7.20-7.30 (m, 2H), 7.45-7.65 (m, 4H), 8.10-8.20 (m, 2H)

(Synthesis of L3)

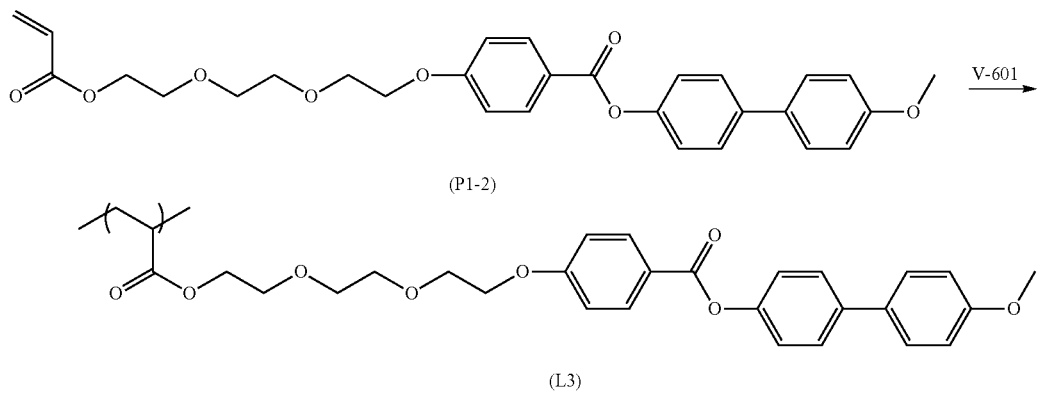

A DMAc solution (3.3 mL) of the compound (P1-2) (1.0 g) was heated until the internal temperature thereof reached 80° C. A DMAc solution (0.5 mL) of dimethyl 2,2'-azobis (2-methylpropionate) (0.54 mmol, 0.12 g) (trade name "V-601", manufactured by Wako Pure Chemical Industries, Ltd.) was added thereto, and the solution was stirred at 80° C. for 2 hours. Thereafter, elimination of the polymerizable group was confirmed by ¹H-NMR spectrum measurement, and the solution was cooled to room temperature. Methanol was added thereto to perform filtration, and the residue was washed with methanol, thereby obtaining 0.95 g of a compound (L3) as a white solid. As a result of analysis of the obtained polymer liquid crystal compound L3 by gel permeation chromatography (GPC), the weight-average molecular weight (Mw) thereof was 10000 (in terms of polystyrene).

<Polymer Liquid Crystal Compound L5>

A polymer liquid crystal compound L5 was synthesized by performing the following steps 1 to 3.

(Step 1)

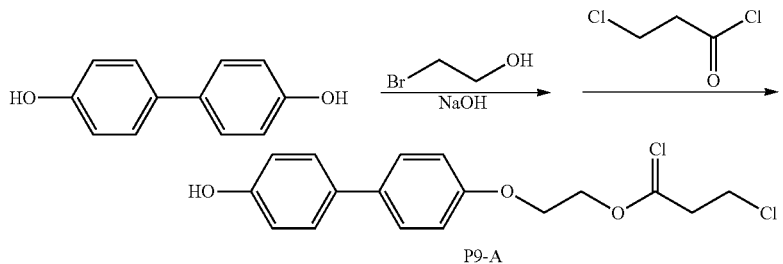

Sodium hydroxide (34.2 g) was dissolved in 1 L of water, and 4,4'-dihydroxybiphenyl (40.6 g) and bromoethanol (37.2 g) were added thereto in a nitrogen atmosphere, and the solution was stirred at 95° C. for 10 hours.

Thereafter, the solution was cooled to room temperature, concentrated hydrochloric acid was added thereto so that the reaction system was adjusted to be acidic, and the resulting solution was filtered and dried, thereby obtaining a compound P9-A as a white solid.

The obtained white solid was dissolved in 400 mL of dimethylacetamide (DMAc), 3-chloropropionyl chloride (62.0 g) was added dropwise thereto under ice-cooling, and the solution was stirred for 5 hours. Methanol (40 mL) was added thereto to stop the reaction, and water and ethyl acetate were added thereto.

The solvent was removed from the organic layer washed by performing the liquid separation operation using a rotary evaporator, and chloroform was added to the obtained concentrate. The precipitated solid was removed by filtration, the solvent was removed using a rotary evaporator, and the residue was purified by column chromatography using ethyl acetate/chloroform, thereby obtaining 20.3 g (yield of 29%) of a compound P9-A as a white solid.

$^1$H-NMR (solvent: DMSO-d$_6$) δ (ppm): 2.80-2.90 (t, 2H), 3.75-3.85 (t, 2H), 4.15-4.25 (m, 2H), 4.35-4.45 (m, 2H), 6.75-6.85 (m, 2H), 6.90-7.00 (m, 2H), 7.30-7.50. (M, 4H), 9.40 (brs, 1H)

(Step 2)

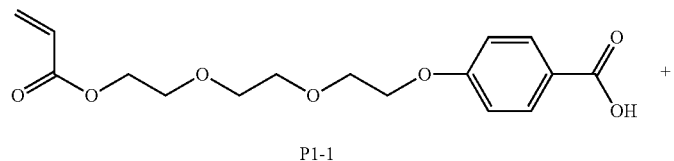

P1-1

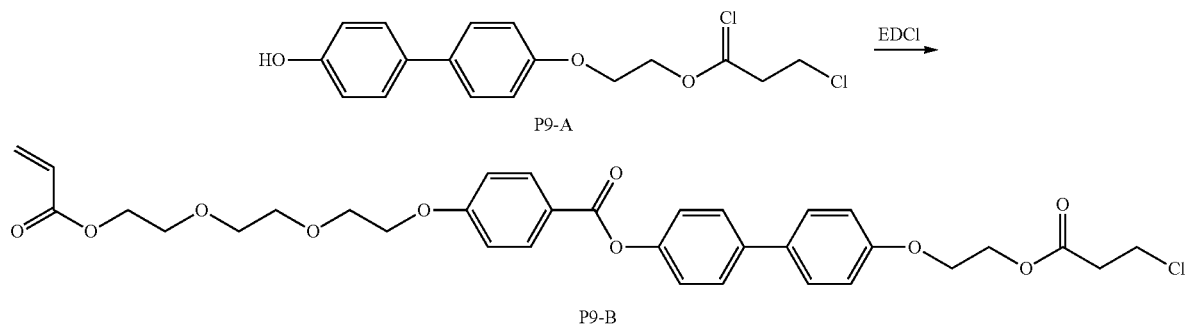

P9-A

P9-B 4.0 g of the compound P9-A, 8.08 g of the compound P1-1 prepared in Synthesis Example 1, and 100 mL of dichloromethane were mixed, and the mixture was stirred at room temperature. 152 mg of N,N-dimethylaminopyridine and 9.56 g of 1-(3-dimethylaminopropyl)-3-ethylcarbodiimide hydrochloride (EDCI) were added to the mixture, and the mixture was stirred at room temperature for 12 hours.

Thereafter, the solvent was removed using a rotary evaporator, and 120 mL of methanol and 120 mL of 1 M aqueous hydrochloric acid were added thereto to perform filtration, thereby obtaining a white solid. The obtained white solid was subjected to liquid separation by adding ethyl acetate and water thereto, and the collected organic layer was washed with 1N aqueous hydrochloric acid and saturated saline and then dried over anhydrous sodium sulfate. The sodium sulfate was separated by filtration, the solvent was removed using a rotary evaporator, and the residue was purified by silica gel chromatography, thereby obtaining 5.4 g (yield of 69%) of a compound P9-B.

$^1$H-NMR (solvent: CDCl$_3$) δ (ppm): 2.87 (t, 2H), 3.68-3.82 (m, 8H), 3.90 (t, 2H), 4.18-4.28 (m, 4H), 4.28-4.38 (m, 2H), 4.46-4.54 (m, 2H), 5.84 (dd, 1H), 6.16 (dd, 1H), 6.43 (dd, 1H), 6.90-7.05 (m, 4H), 7.20-7.30 (m, 2H), 7.48-7.65 (m, 4H), 8.10-8.20 (m, 2H)

(Step 3)

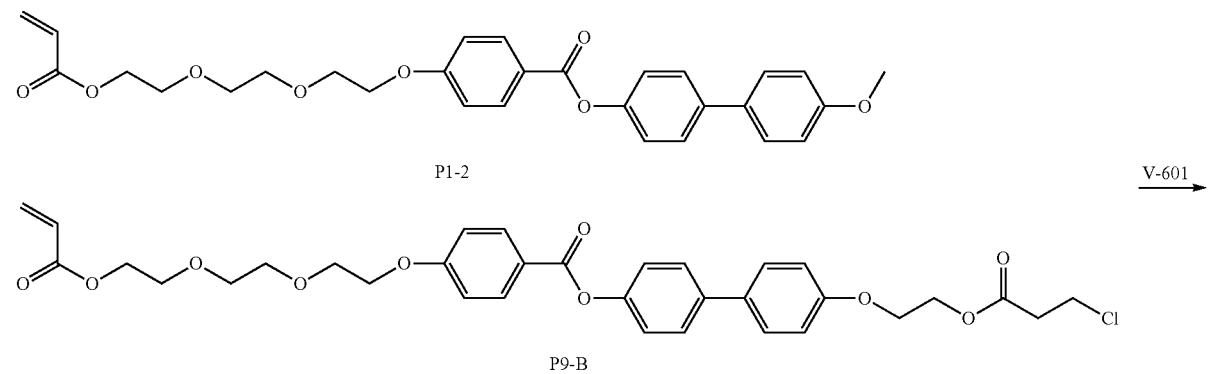

P1-2

P9-B

V-601

-continued

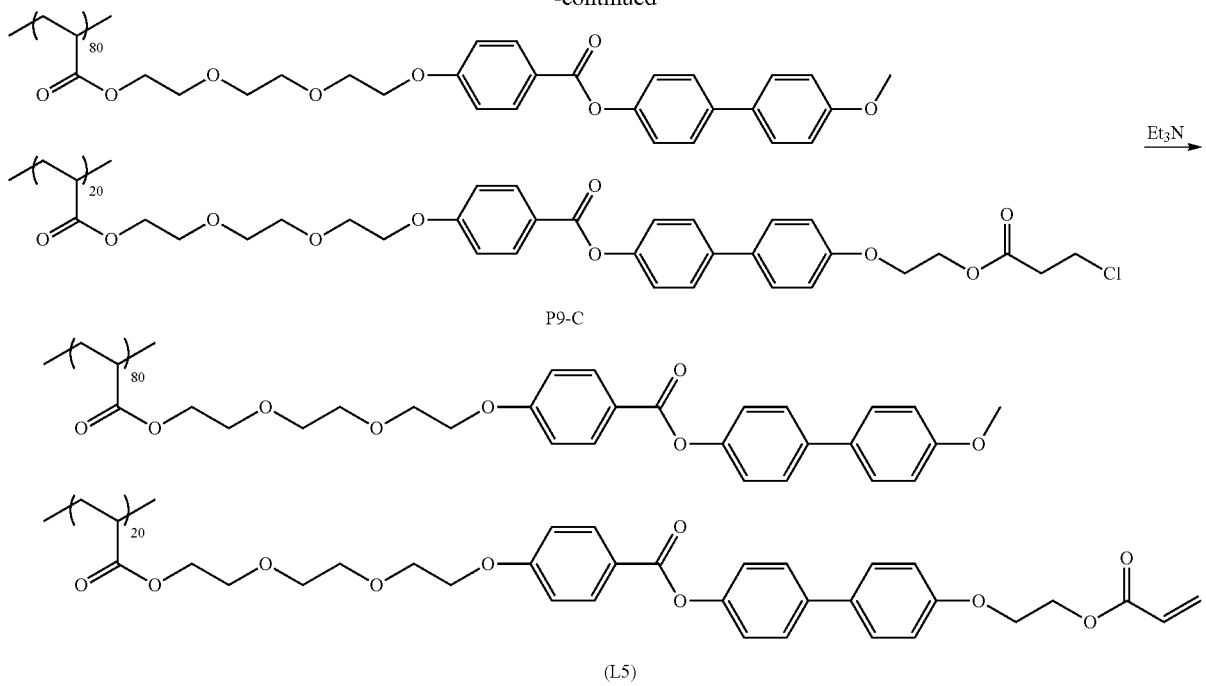

A DMAc solution (3.3 mL) of the compound P1-2 (0.8 g) and the compound P9-B (0.2 g) was heated until the internal temperature thereof reached 80° C. under a nitrogen stream. A solution of dimethyl 2,2'-azobis(2-methylpropionate) (0.054 mmol, 0.012 g) in DMAc (0.5 mL) was added thereto, and the solution was stirred at 80° C. for 2 hours. Thereafter, elimination of the polymerizable group was confirmed by $^1$H-NMR spectrum measurement, and the solution was cooled to room temperature. Methanol was added thereto to perform filtration, and the residue was washed with methanol, thereby obtaining 0.90 g of a compound P9-C as a white solid. Dibutylhydroxytoluene (BHT) (50 mg) and triethylamine (0.7 mL) were added to a chloroform solution (7 mL) of the obtained compound P9-C, and the internal temperature was heated to 50° C. The solution was stirred at 50° C. for 9 hours, elimination of the raw materials was confirmed by $^1$H-NMR spectrum measurement, and the solution was cooled to room temperature. Methanol was added thereto to perform filtration, and the residue was washed with methanol, thereby obtaining 0.8 g of a polymer liquid crystal compound L5 as a white solid. As a result of analysis of the obtained polymer liquid crystal compound L5 by gel permeation chromatography (GPC), the weight-average molecular weight (Mw) thereof was 17000 (in terms of polystyrene).

<Polymer Liquid Crystal Compound L6>

A polymer liquid crystal compound L6 was synthesized by performing the following steps 1 and 2.

(Step 1)

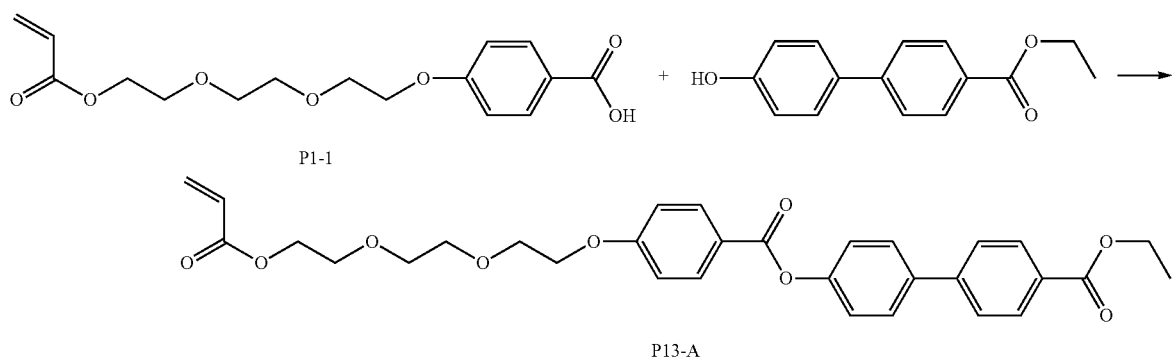

Ethyl 4-(4-hydroxyphenyl) benzoate was synthesized according to the method described in Macromolecules, 2002, 35, 1663 to 1671.

2,2,6,6-Tetramethylpiperidine 1-oxyl (68 mg) was added to a solution of methanesulfonyl chloride (MsCl) (54.8 mmol, 6.27 g) in ethyl acetate (44 mL), and the internal temperature thereof was lowered to −5° C. A THF solution of the compound (P1-1) (52.6 mmol, 17.1 g) and diisopropylethylamine (DIPEA) (57.0 mol, 7.36 g) was added dropwise thereto such that the internal temperature thereof did not rise above 0° C. or higher. The solution was stirred at −5°

C. for 30 minutes, a solution of ethyl 4-(4-hydroxyphenyl) benzoate (43.8 mmol, 10.6 g) in DMAc and N-methyl-imidazole (NMI) (1.8 g) were added thereto, and diisopropylethylamine (75.6 mmol, 13.0 mL) was added dropwise thereto such that the internal temperature thereof did not rise above 0° C. or higher. Thereafter, the solution was stirred at room temperature for 4 hours. The reaction was stopped by adding water and ethyl acetate to the solution. Liquid separation was performed so that the solvent was removed from the organic layer extracted with ethyl acetate using a rotary evaporator, and the organic layer was purified by column chromatography using ethyl acetate and hexane, thereby obtaining 20.6 g (yield of 86%) of a compound (P13-A) as a white solid.

$^1$H-NMR (solvent: CDCl$_3$) δ (ppm): 1.41 (t, 3H), 3.68-3.80 (m, 6H), 3.88-3.95 (m, 2H), 4.20-4.27 (m, 2H), 4.31-4.38 (m, 2H), 4.41 (q, 2H), 5.83 (dd, 1H), 6.16 (dd, 1H), 6.43 (dd, 1H), 6.97-7.05 (m, 2H), 7.28-7.35 (m, 2H), 7.64-7.72 (m, 4H), 8.08-8.20 (m, 4H)

(Step 2)

meation chromatography (GPC), the weight-average molecular weight (Mw) thereof was 16000 (in terms of polystyrene).

<Polymer Liquid Crystal Compounds L4, L7, and R1 to R3>

Polymer liquid crystal compounds L4, L7, and R1 to R3 described below were synthesized according to the same method as that for the above-described polymer liquid crystal compounds or according to a known method.

[Dichroic Material]

<Dichroic Material D1>

First, 4-hydroxybutyl acrylate (20 g) and mesyl chloride (16.8 g, MsCl) were dissolved in ethyl acetate (90 mL), and then triethylamine (16.4 g, NEt$_3$) was added dropwise thereto while the solution was cooled in an ice bath. Thereafter, the resulting solution was stirred at room temperature for 2 hours, and 1N HCl was added thereto to perform liquid separation. The obtained organic layer was distilled off under reduced pressure, thereby obtaining a compound X (30 g) with the following structure.

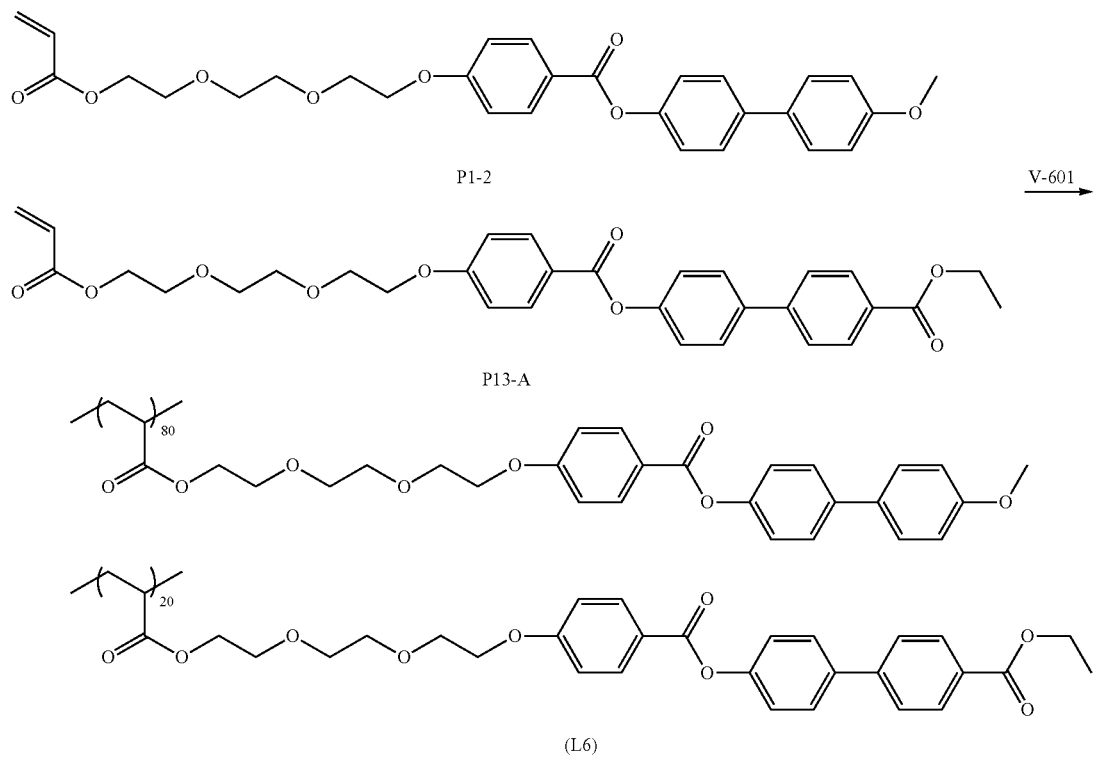

A DMAc solution (3.3 mL) of the compound P1-2 (0.8 g) and the compound P13-A (0.2 g) was heated until the internal temperature thereof reached 80° C. under a nitrogen stream. A DMAc solution (0.5 mL) of dimethyl 2,2'-azobis (2-methylpropionate) (0.054 mmol, 0.012 g) (trade name "V-601", manufactured by Wako Pure Chemical Industries, Ltd.) was added thereto, and the solution was stirred at 80° C. for 2 hours. Thereafter, elimination of the polymerizable group was confirmed by $^1$H-NMR spectrum measurement, and the solution was cooled to room temperature. Methanol was added thereto to perform filtration, and the residue was washed with methanol, thereby obtaining 0.96 g of a compound (L6) as a white solid. As a result of analysis of the obtained polymer liquid crystal compound L6 by gel per-

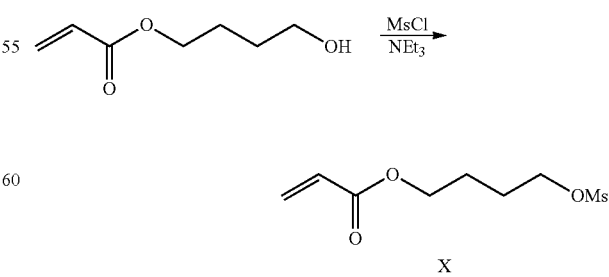

Further, the dichroic material D1 was synthesized according to the following route.

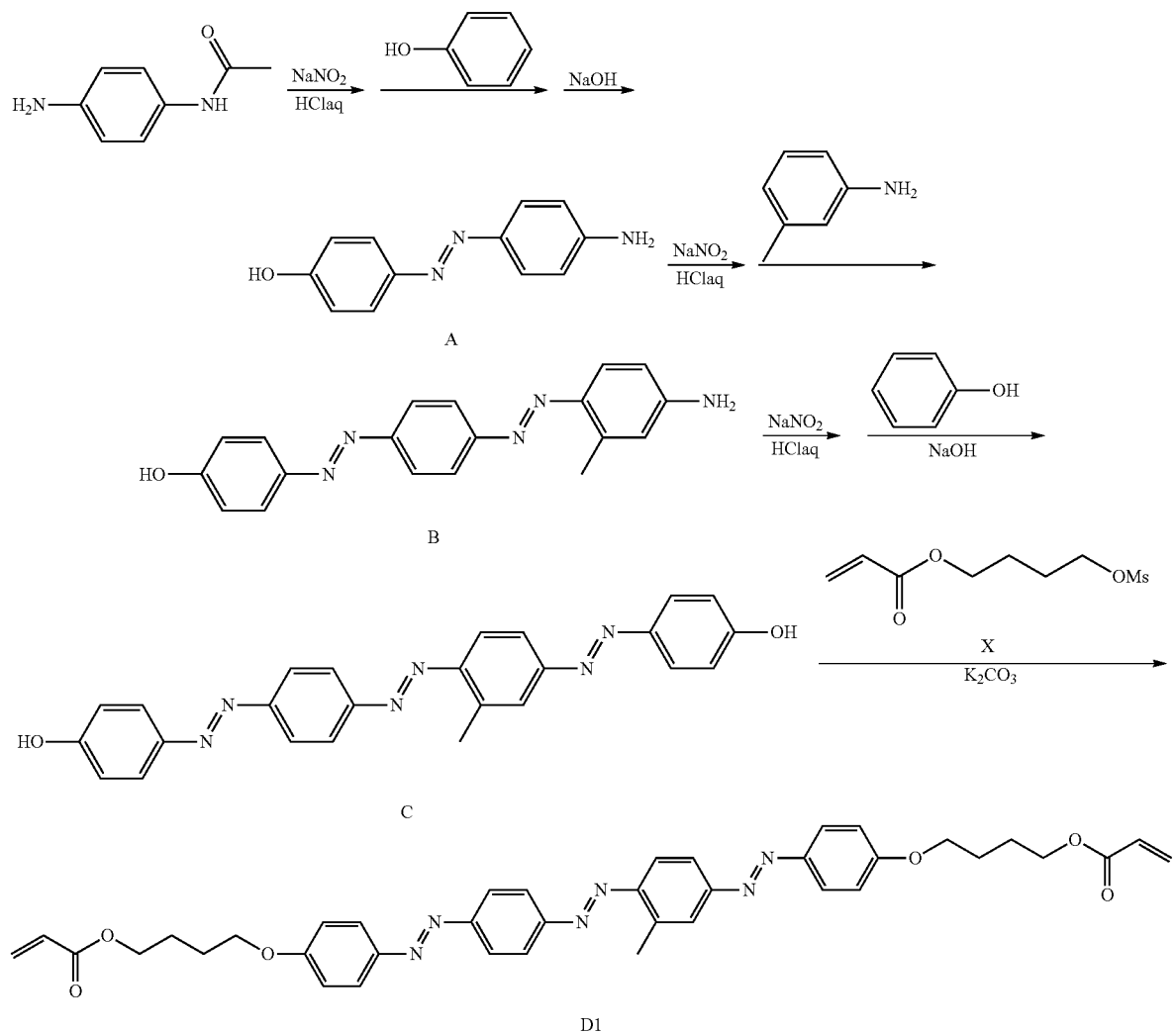

C

D1

First, a compound A (10 g) was synthesized according to the literature (Chem. Eur. J. 2004. 10. 2011).

The compound A (10 g) was dissolved in water (300 mL) and hydrochloric acid (17 mL), the solution was cooled in an ice bath, sodium nitrite (3.3 g) was added thereto, and the resulting solution was stirred for 30 minutes. Further, m-toluidine (5.1 g) was added thereto after addition of amidosulfuric acid (0.5 g), and the solution was stirred at room temperature for 1 hour. After the solution was stirred, the solid obtained by neutralization with hydrochloric acid was collected by suction filtration, thereby obtaining a compound B (3.2 g).

The compound B (1 g) was dissolved in a THF solution consisting of tetrahydrofuran (30 mL, THF), water (10 mL), and hydrochloric acid (1.6 mL), the solution was cooled in an ice bath, sodium nitrite (0.3 g) was added thereto, the resulting solution was stirred for 30 minutes, and amidosulfuric acid (0.5 g) was further added thereto. Separately, phenol (0.4 g) was dissolved in potassium carbonate (2.76 g) and water (50 mL), the solution was cooled in an ice bath, the above-described THF solution was added dropwise thereto, and the resulting solution was stirred at room temperature for 1 hour. After the solution was stirred, water (200 mL) was added, and the obtained compound C (1.7 g) was suction-filtered.

The compound C (0.6 g), the compound X (0.8 g), and potassium carbonate (0.95 g) were dissolved in DMAc (30 mL, dimethylacetamide) and the solution was stirred at 90° C. for 3.5 hours. After the solution was stirred, water (300 mL) was added, the obtained solid was suction-filtered, thereby obtaining a dichroic material D1 (0.3 g).

<Dichroic Materials D2 and D3>

The dichroic materials D2 to D3 described below were synthesized according to the same method as that for the dichroic material D1 or according to a known method.

[Preparation of Polarizer]

A polarizer was prepared as follows. In all polarizers, the polymer liquid crystal compound and the dichroic material were horizontally aligned. The method of evaluating the horizontal alignment is as described above.

Example 1

<Preparation of Alignment Film>

A glass base material (manufactured by Central Glass Co., Ltd., blue plate glass, size of 300 mm×300 mm, thickness of 1.1 mm) was washed with an alkaline detergent, pure water was poured thereinto, and the glass base material was dried.

The dried glass base material was coated with the following composition 1 for forming an alignment film using a

12 bar, and the applied composition 1 for forming an alignment film was dried at 110° C. for 2 minutes to form a coating film on the glass base material.

The obtained coating film was subjected to a rubbing treatment (roller rotation speed: 1000 rotations/spacer thickness of 2.9 mm, stage speed of 1.8 m/min) once to prepare an alignment film 1 on the glass base material.

| Composition of composition 1 for forming alignment film |
|---|
| Modified vinyl alcohol (see Formula (PVA-1)): 2.00 parts by mass<br>Water: 74.08 parts by mass<br>Methanol: 23.86 parts by mass<br>Photopolymerization initiator<br>(IRGACURE 2959, manufactured by BASF SE): 0.06 parts by mass |

<Preparation of Polarizer>

A piece with a size of 30 mm×30 mm was cut out from the obtained alignment film 1 and spin-coated with the following polarizer-forming composition 1 at 1000 rotations to form a coating film.

The coating film was dried at room temperature for 30 seconds and further heated at 150° C. for 15 seconds.

Next, the coating film was cooled to room temperature, heated to 80° C., and cooled to room temperature, thereby preparing a polarizer 1 on the alignment film 1.

| Composition of polarizer-forming composition 1 |
|---|
| Polymer liquid crystal compound L1 shown below: 6.584 parts by mass<br>Dichroic material D1 shown below: 0.362 parts by mass<br>Interface modifier F1 shown below: 0.053 parts by mass<br>Chloroform: 93.000 parts by mass |

PVA-1

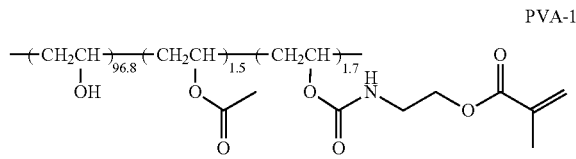

L1

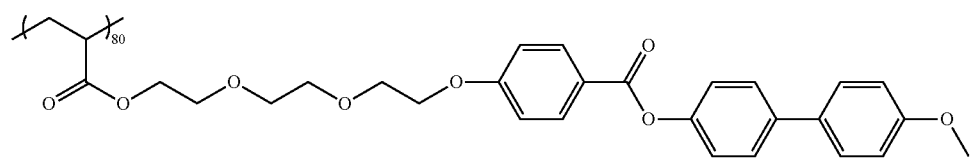

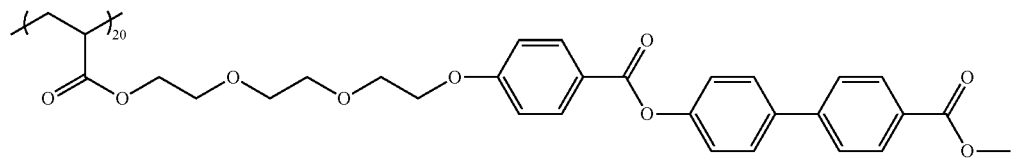

D1

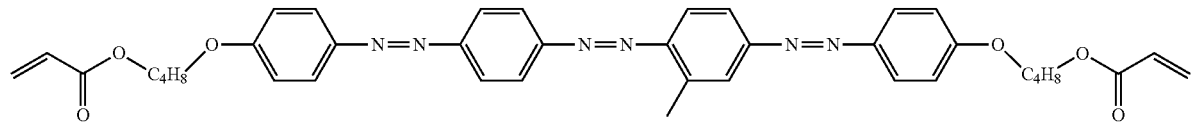

F1

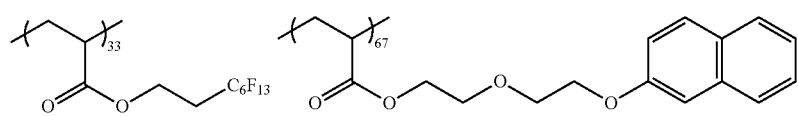

Examples 2 to 12 and Comparative Examples 1 to 3

Each polarizer was prepared according to the same procedure as in Example 1 except that the polarizer-forming composition with the composition listed in Table 1 was used in place of the polarizer-forming composition 1.

[Polymer Liquid Crystal Compound]

The polymer liquid crystal compounds used in each example are shown below.

Further, L1 to L7 are all thermotropic liquid crystals and crystalline polymers as described below, and thus correspond to the above-described specific compounds.

Meanwhile, since R1 to R3 are all thermotropic liquid crystals, but are not crystalline polymers as described below, R1 to R3 do not correspond to the above-described specific compounds.

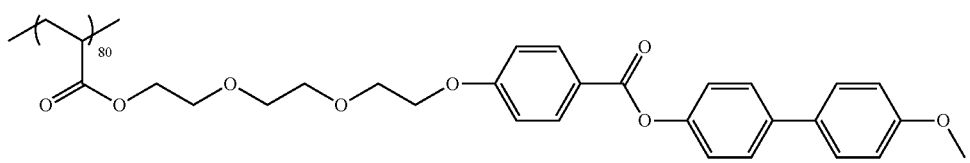

L1

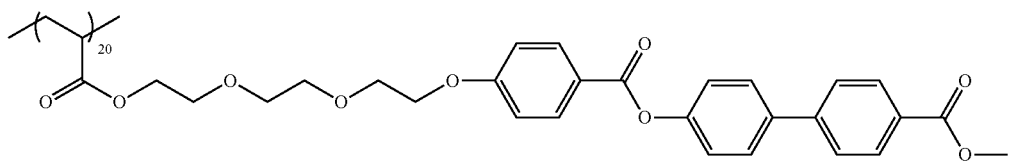

L2

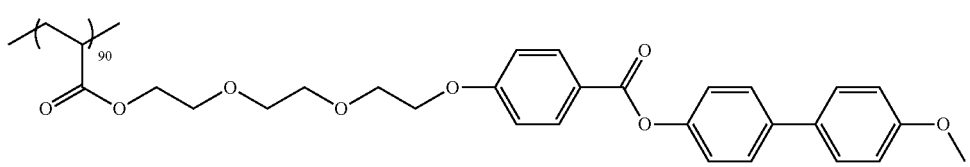

L3

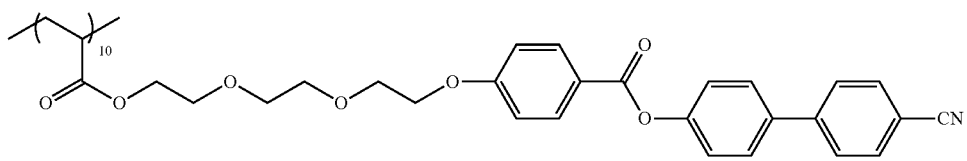

L4

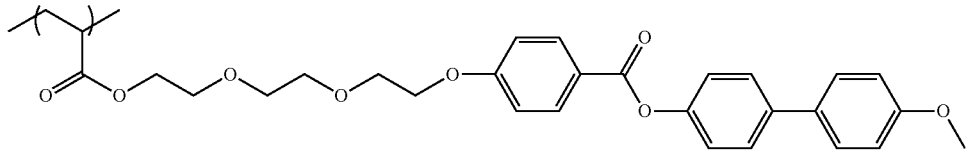

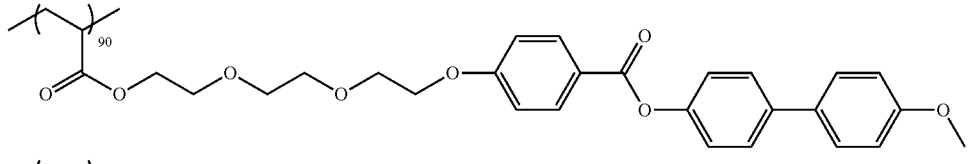

L5

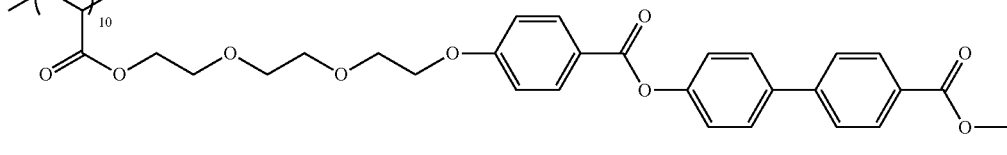

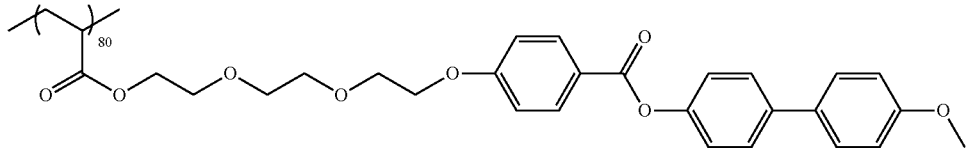

-continued
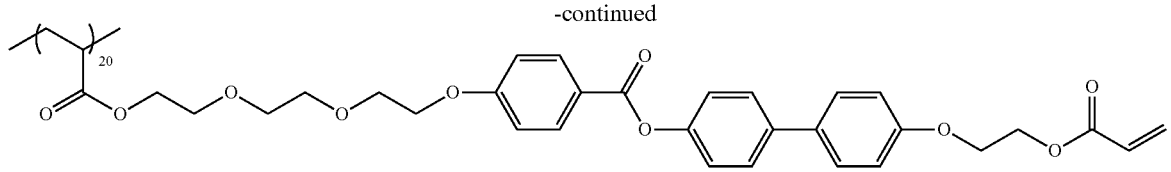
L6
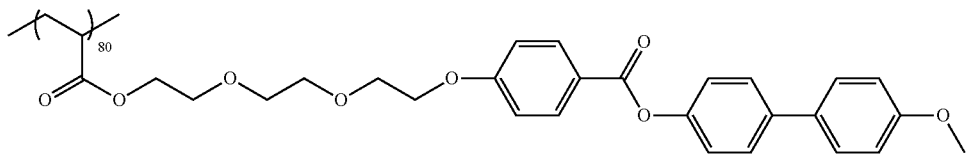
L7
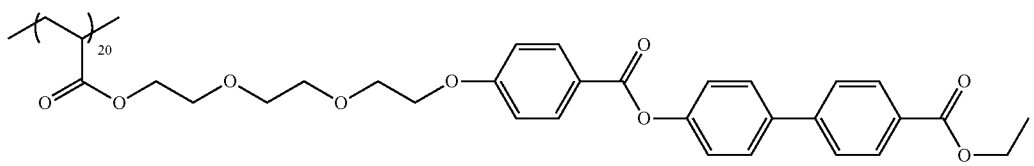
R1
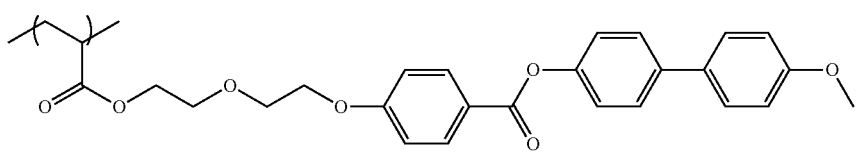
R2
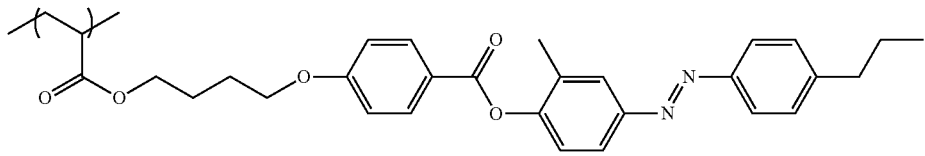
R3
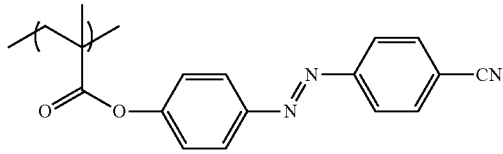
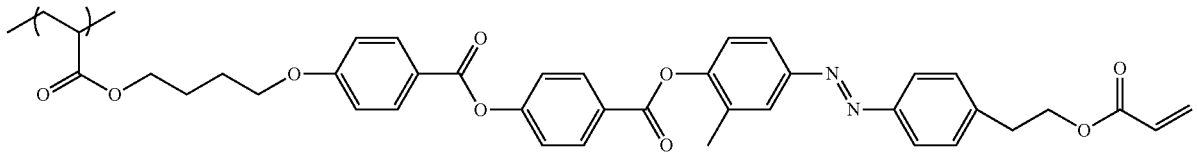
[Dichroic Material]
The dichroic materials used in each example are collectively shown below.
D1
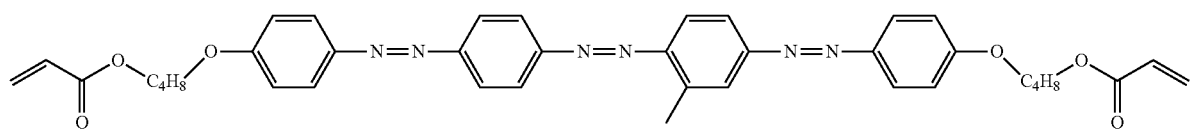
D2
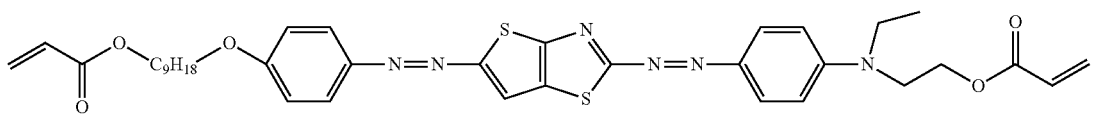

-continued

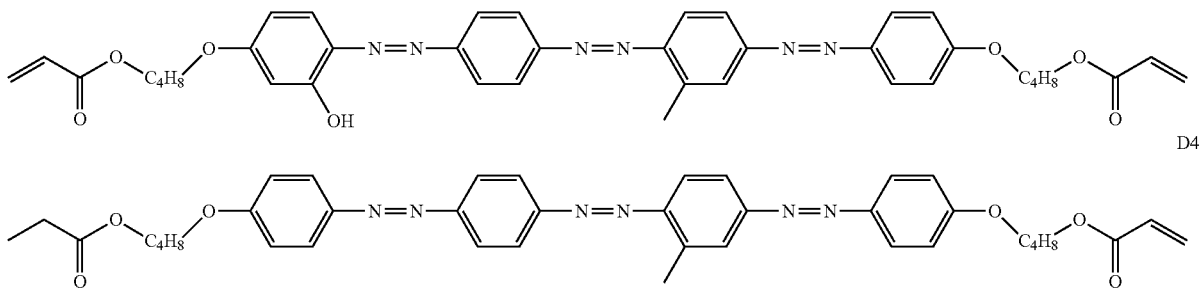

[Interface Modifier]
The interface modifier used in each example is shown below.

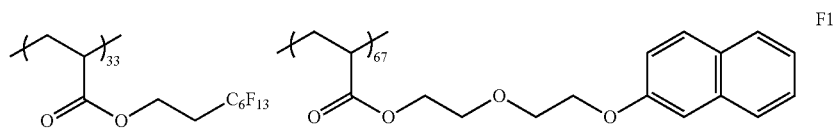

[Evaluation]
As described below, the polymer liquid crystal compounds, the polarizer-forming compositions, and the polarizers were evaluated.

[Crystallinity and Crystallization Temperature of Polymer Liquid Crystal Compound]
As described below, the presence or absence of crystallinity and the crystallization temperature of each of the polymer liquid crystal compounds (L1 to L7 and R1 to R3) were evaluated.

Two polarizers of an optical microscope (ECLIPSE E600 POL, manufactured by Nikon Corporation) were disposed so as to be orthogonal to each other, and a sample table was set between the two polarizers. Further, a small amount of the polymer liquid crystal compound was placed on slide glass, and the slide glass was set on a hot stage placed on the sample table. While the state of the sample was observed, the temperature of the hot stage was increased to a temperature at which the polymer liquid crystal compound exhibited liquid crystallinity, and the polymer liquid crystal compound was allowed to enter a liquid crystal state. After the polymer liquid crystal compound entered the liquid crystal state, the behavior of the liquid crystal phase transition was observed while the temperature of the hot stage was gradually lowered, and the temperature of the liquid crystal phase transition was recorded. In a case where the polymer liquid crystal compound exhibited a plurality of liquid crystal phases (for example, a nematic phase and a smectic phase), all the transition temperatures were also recorded.

Next, approximately 5 mg of a sample of the polymer liquid crystal compound was put into an aluminum pan, and the pan was covered and set on a differential scanning calorimeter (DSC) (an empty aluminum pan was used as a reference). The polymer liquid crystal compound measured in the above-described manner is heated to a temperature at which the compound exhibits a liquid crystal phase, and the temperature is maintained for 1 minute. Thereafter, the calorific value was measured while the temperature was lowered at a rate of 10° C./min. An exothermic peak was confirmed from the obtained calorific value spectrum.

As a result, in the compounds L1 to L7, exothermic peaks due to crystallization were observed at temperatures other than the above-described liquid crystal phase transition temperature. That is, it was confirmed that the compounds L1 to L7 were crystalline polymers. The crystallization temperatures of L1 to L7 are listed in Table 1.

Meanwhile, in the compounds R1 to R3, exothermic peaks due to crystallization were not observed at temperatures other than the above-described liquid crystal phase transition temperature. That is, it was confirmed that the compounds R1 to R3 were not crystalline polymers (non-crystalline polymers).

[Crystallinity and Crystallization Temperature of the Polarizer-Forming Composition]
The polarizer-forming composition in each example and each comparative example was cast on the above-described glass base material and heated at a temperature higher than the liquid crystal phase transition temperature by 10° C. for 15 seconds using a hot plate. After the temperature thereof was lowered to room temperature, the cast film was scraped off, and the crystallinity and crystallization temperature were evaluated according to the same method as that for the above-described polymer liquid crystal compound.

As a result, in Examples 1 to 12, exothermic peaks due to crystallization were observed. The crystallization temperatures thereof are listed in Table 1.

Meanwhile, in Comparative Examples 1 to 3, exothermic peaks due to crystallization were not observed.

[Degree of Alignment]
Each polarizer of the examples and the comparative examples was set on a sample table in a state where a linear polarizer was inserted into the light source side of an optical microscope (product name "ECLIPSE E600 POL", manufactured by Nikon Corporation), and the absorbance of the polarizer in a wavelength range listed in Table 1 was measured using a multichannel spectrometer (product name "QE65000", manufactured by Ocean Optics, Inc.). Next, the degree of alignment was calculated according to the following equation. The results are listed in Table 1. Practically, the degree of alignment is preferably 0.93 or greater.

Degree of alignment: $S=((Az0/Ay0)-1)/((Az0/Ay0)+2)$

Az0: Absorbance of polarizer with respect to polarized light in absorption axis direction Ay0: Absorbance of polarizer with respect to polarized light in polarization axis direction

[Haze]

Each polarizer of the examples and the comparative examples was set on a sample table in a state where a linear polarizer was inserted into the light source side of an optical microscope (product name "ECLIPSE E600 POL", manufactured by Nikon Corporation), the polarizer was observed during rotation of the sample table, and the evaluation was performed visually based on the following evaluation standards. The results are listed in Table 1. As a result, A is preferable.

A: Haze was not observed.
B: Haze was slightly observed.

[X-Ray Diffraction Peak]

The surface of the obtained polarizer 1 was irradiated with X-rays under the following conditions using an X-ray diffractometer for evaluating a thin film (trade name "Smart-Lab" manufactured by Rigaku Corporation) to perform in-plane XRD.

Cu ray source (CuKα, output of 45 kV, 200 mA) to be used
X-ray incidence angle of 0.2°
Optical system used: parallel optical system (CBO (PB))
Incident side, incident slit: 0.2 mm, incident parallel slit in-plane PSC, 0.5 deg, longitudinal limit slit: 10 mm
Light-receiving side, light-receiving slit: 20 mm, light-receiving parallel slit in-plane PSA, 0.5 deg
Detector: HyPix3000 (OD mode), manufactured by Rigaku Corporation 2θχ/φ Scan, scan conditions: 0.008 degrees/step, 2.0 degrees/min in range of 1 to 40 degrees
φ Scan, scan condition: 0.5 degree/step, 9.6 degree/min in range of −120 to 120 degrees The direction in which the polymer liquid crystal and the dichroic material were aligned in the major axis direction was set as an azimuthal angle (φ) of 0°, in-plane ΔXRD (2θχ/φ scan) was performed in all directions for every 15°, and the direction orthogonal to the orientation in the substrate plane where the peak intensity became the maximum was set as the direction of the alignment axis based on φ scan performed with respect to the observed peak. The measurement was performed using CuKα at an incidence angle of 0.20°. Using the peak in the direction orthogonal to the alignment axis direction, the period length was acquired from the following relationship between the diffraction angle and the distance. The value was standardized as a film thickness corresponding to the X-ray penetration length at an X-ray incidence angle of 0.2°, and the peak intensity was calculated (cps notation).

$d=\lambda/(2\times\sin\theta)$ ($d$: distance, $\lambda$: incident X-ray wavelength (CuKα; 1.5418 Å))

In the polarizer 1, the peaks a were observed at positions where 2θ was 2.8° (period length: 31.6 Å), 4.9° (period length: 18.1 Å), and 7.9° (period length: 11.6 Å), and the broad peak b (halo) was observed at a position where 2θ was approximately 18 to 22° (period length: 4 to 5 Å), in the direction where φ was 90°.

Here, since all the half-widths of the peaks a are less than 2°, all the peaks a correspond to the above-described peak A. Since the half-width of the peak b is 2° or greater, the peak b corresponds to the above-described peak B.

The intensities of the peaks a were respectively 1900, 1670, and 1100 from the low angle side, and the intensity of the peak b (halo) was 300. Further, a difference between the baseline intensity and the peak top intensity was defined as the peak intensity.

TABLE 1

| | Polymer liquid crystal compound | | First dichroic material | | Second dichroic material | | Interface modifier | | Chloroform | Crystalline temperature | | Degree of alignment | | Haze |
|---|---|---|---|---|---|---|---|---|---|---|---|---|---|---|
| | | Part by mass | | Part by mass | | Part by mass | | Part by mass | Part by mass | Polymer liquid crystal compound | Polarizer-forming composition | 400-500 nm | 400-700 nm | Visual observation |
| | Type | | Type | | Type | | Type | | | | | | | |
| Example 1 | L1 | 6.584 | D1 | 0.362 | | | F1 | 0.053 | 93.000 | 70 | 81 | 0.95 | — | A |
| Example 2 | L2 | 6.493 | D1 | 0.455 | | | F1 | 0.052 | 93.000 | 70 | 77 | 0.96 | — | A |
| Example 3 | L3 | 6.097 | D1 | 0.854 | | | F1 | 0.049 | 93.000 | 91 | 83 | 0.95 | — | A |
| Example 4 | L3 | 5.992 | D1 | 0.420 | D2 | 0.539 | F1 | 0.048 | 93.000 | 91 | 78 | — | 0.95 | A |
| Example 5 | L1 | 5.992 | D1 | 0.420 | D2 | 0.539 | F1 | 0.048 | 93.000 | 70 | 72 | — | 0.96 | A |
| Example 6 | L2 | 5.992 | D1 | 0.420 | D2 | 0.539 | F1 | 0.048 | 93.000 | 70 | 69 | — | 0.96 | A |
| Example 7 | L4 | 5.992 | D1 | 0.420 | D2 | 0.539 | F1 | 0.048 | 93.000 | 74 | 86 | — | 0.94 | B |
| Example 8 | L5 | 5.992 | D1 | 0.420 | D2 | 0.539 | F1 | 0.048 | 93.000 | 63 | 56 | — | 0.95 | A |
| Example 9 | L2 | 5.992 | D3 | 0.420 | D2 | 0.539 | F1 | 0.048 | 93.000 | 70 | 74 | 0.95 | — | A |
| Example 10 | L6 | 5.992 | D1 | 0.420 | D2 | 0.539 | F1 | 0.048 | 93.000 | 73 | 71 | — | 0.96 | A |
| Example 11 | L7 | 5.992 | D1 | 0.959 | | | F1 | 0.048 | 93.000 | 111 | 87 | 0.94 | — | B |
| Example 12 | L1 | 6.584 | D4 | 0.362 | | | F1 | 0.053 | 93.000 | 70 | 82 | 0.95 | — | A |
| Comparative Example 1 | R1 | 6.493 | D1 | 0.455 | | | F1 | 0.052 | 93.000 | None | None | 0.84 | — | A |
| Comparative Example 2 | R2 | 6.493 | D1 | 0.455 | | | F1 | 0.052 | 93.000 | None | None | 0.85 | — | A |
| Comparative Example 3 | R3 | 5.818 | D1 | 0.480 | D2 | 0.655 | F1 | 0.047 | 93.000 | None | None | — | 0.92 | A |

Based on the results listed in Table 1, in Examples 1 to 12 in which the specific compound which was a crystalline polymer was used as the polymer liquid crystal compound, the degree of alignment was high. Among these, in Examples 1 to 6, 8 to 10, and 12 in which the crystallization temperature of the polarizer-forming composition was 85° C. or lower, the haze was more satisfactory.

Based on the comparison of Examples 1 to 3 and 11 (comparison between the forms in which only D1 was used as the dichroic material), the degree of alignment was higher in Examples 1 to 3 in which the crystallization temperature of the specific compound was 95° C. or lower. Among these, in Example 2 in which the specific compound had the repeating unit (repeating unit (1)) represented by Formula (1), and T1 in Formula (1) was a cyano group, the degree of alignment was higher.

Based on the comparison between Example 3 and Example 11 (comparison between the forms in which only D1 was used as the dichroic material and the specific compound consisted of only one kind of repeating unit represented by Formula (1)), in Example 3 in which the spacer group represented by SP1 in Formula (1) was a group represented by *—(CH$_2$—CH$_2$O)$_{n1}$—* and n1 was 3, the degree of alignment was higher and the haze was more satisfactory.

Based on the comparison between Examples 5 and 7 (comparison between the forms in which the specific compound has a repeating unit A in which T1 represents an alkoxy group and a repeating unit B in which T1 represents a methoxycarbonyl group), in Example 5 in which the ratio (A/B) between the content of the repeating unit A and the content of the repeating unit B was in a range of 70/30 to 85/15, the haze was more satisfactory.

Based on the comparison of Examples 5 to 8 and 10 (comparison between the forms in which the specific compound has a repeating unit A in which T1 represents an alkoxy group and a repeating unit B in which T1 represents a group other than the alkoxy group, and the ratio (A/B) between the content of the repeating unit A and the content of the repeating unit B is 80/20), in Examples 5 and 10 in which T1 of the repeating unit B represents an alkoxycarbonyl group, the degree of alignment was higher.

Meanwhile, in Comparative Examples 1 to 3 in which a non-crystalline polymer was used as the polymer liquid crystal compound, the degree of alignment was insufficient.

[Influence of Crystallinity on Vertical Alignment]

In the polarizer in which the polymer liquid crystal compound and the dichroic material were vertically aligned, the influence of the crystallinity of the polymer liquid crystal compound on the degree of alignment was examined.

Reference Example 1

The alignment film was spin-coated with the following polarizer-forming composition X1 at a speed of 1000 rotations to form a coating film. After the coating film was dried at room temperature for 30 seconds, the coating film was heated to 140° C., maintained for 30 seconds, and cooled to room temperature. Next, the coating film was reheated to 80° C., maintained for 30 seconds, and then cooled to room temperature, thereby preparing a polarizer X1 on the alignment film.

In the polarizer X1, it was confirmed that the polymer liquid crystal compound and the dichroic material were not horizontally aligned (vertically aligned). The method of evaluating the vertical alignment is the same as that for the above-described horizontal alignment.

| Composition of polarizer-forming composition X1 |
| --- |
| Polymer liquid crystal compound L1 shown above: 4.011 parts by mass |
| Dichroic material D1 shown above: 0.792 parts by mass |
| Dichroic material D2 shown above: 0.963 parts by mass |
| Interface modifier F2 shown below: 0.087 parts by mass |
| Interface modifier F3 shown below: 0.073 parts by mass |
| Interface modifier F4 shown below: 0.073 parts by mass |
| Tetrahydrofuran: 79.901 parts by mass |
| Cyclopentanone: 14.100 parts by mass |

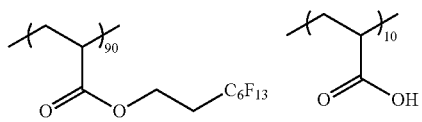

F2

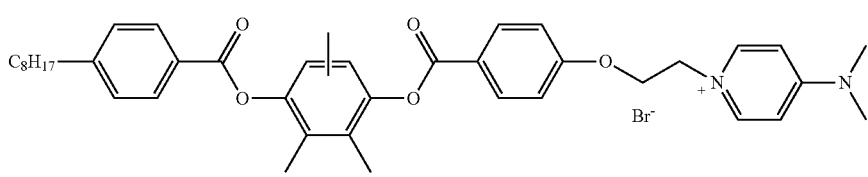

F3

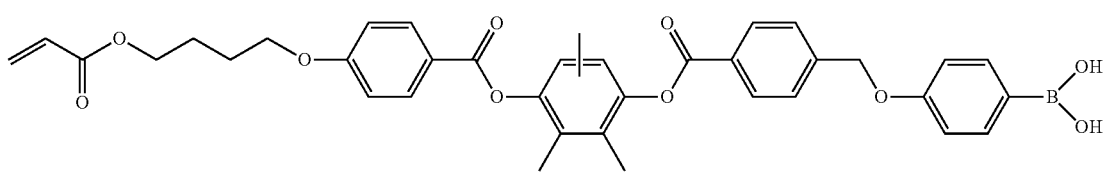

F4

The Mueller matrix of the polarizer X1 at a wavelength λ was calculated based on the polar angle measured for every 10° from −50° to 50° using AxoScan OPMF-1 (manufactured by Opto science, Inc.). The extinction coefficient ko [λ] (in-plane direction) and the extinction coefficient ke [λ] (thickness direction) were calculated by removing the influence of the surface reflection and fitting the result to the following theoretical formula in consideration of the Snell's formula and Fresnel's equations. Unless otherwise specified, the wavelength λ is 550 nm.

$$k=-\log(T) \times \lambda/(4\pi d)$$

Here, T represents the transmittance, and d represents the thickness of the polarizer.

Based on the calculated ko [λ] and ke [λ], the absorbance and the dichroic ratio in the in-plane direction and thickness direction were calculated, and the degree of vertical alignment was finally acquired. As a result, the degree of vertical alignment was 0.92.

Reference Example 2

A polarizer X2 was prepared according to the same procedures as in Reference Example 1 except that the following polarizer-forming composition X2 was used in place of the polarizer-forming composition X1.

In the polarizer X2, it was confirmed that the polymer liquid crystal compound and the dichroic material were not horizontally aligned (vertically aligned). The method of evaluating the vertical alignment is the same as that for the above-described horizontal alignment.

As a result of evaluation of the degree of vertical alignment in the same manner as in Reference Example 1, the degree of vertical alignment was 0.92.

| Composition of polarizer-forming composition X2 |
|---|
| Polymer liquid crystal compound R3 shown below: 4.001 parts by mass |
| Dichroic material D1 shown below: 0.875 parts by mass |
| Dichroic material D2 shown below: 1.125 parts by mass |
| Interface modifier F2 shown above: 0.087 parts by mass |
| Interface modifier F3 shown above: 0.073 parts by mass |
| Interface modifier F4 shown above: 0.073 parts by mass |
| Tetrahydrofuran: 79.701 parts by mass |
| Cyclopentanone: 14.065 parts by mass |

Based on the evaluation results of the degree of vertical alignment in Reference Examples 1 and 2, the degree of vertical alignment in Reference Example 1 in which the polymer liquid crystal compound was crystalline was the same as in Reference Example 2 in which the polymer liquid crystal compound was amorphous. That is, it was confirmed that in a case where the polymer liquid crystal compound and the dichroic material were vertically aligned, the crystallinity of the polymer liquid crystal compound did not affect the degree of alignment.

Meanwhile, as described above, in a case where the polymer liquid crystal compound and the dichroic material are horizontally aligned, the degree of alignment is greatly improved by using a crystalline polymer as the polymer liquid crystal compound.

Based on this result, the effect that the degree of alignment is greatly improved in a case where a crystalline polymer is used as the polymer liquid crystal compound is a special effect obtained in a case where the polymer liquid crystal compound and the dichroic material are horizontally aligned.

What is claimed is:

1. A polarizer which is formed of a polarizer-forming composition containing a polymer liquid crystal compound and a dichroic material,
   wherein the polymer liquid crystal compound is a thermotropic liquid crystal and a crystalline polymer, showing a transition from a crystal phase to a liquid crystal phase, and vice versa, due to a change in temperature,
   wherein the polymer liquid crystal compound and the dichroic material are horizontally aligned,
   wherein the polymer liquid crystal compound has two kinds of repeating units represented by Formula (1),

in Formula (1), P1 represents a main chain of the repeating unit, L1 represents a single bond or a divalent linking group, SP1 represents a spacer group, M1 represents a mesogen group, and T1 represents a terminal group,
   wherein a peak A1 with a diffraction angle of less than 10°, a half-width of less than 2° and a peak intensity of 100 cps or greater, and a peak B with a diffraction angle of 17° or greater, and a half-width of 2° or greater, are observed in an X-ray diffraction (XRD) spectrum of the polarizer, where the polymer liquid crystal compound and the dichroic material are aligned in a major axis direction on the measuring thin film X-ray diffractometer that is parallel to the incident X-ray (alignment axis direction) and the azimuthal angle (φ) is set to 0°, the X-ray diffraction spectrum being acquired by performing in-plane XRD (2θχ/φ Scan) under the following scan conditions in an orientation in which a peak intensity is maximum in a direction orthogonal to the alignment axis direction, with scan conditions: 0.008 degrees/step, 2.0 degrees/min in a range of 1 to 40 degrees.

2. The polarizer according to claim 1,
   wherein a crystallization temperature of the polymer liquid crystal compound is 120° C. or lower.

3. The polarizer according to claim 1,
   wherein a crystallization temperature of the polarizer-forming composition is 100° C. or lower.

4. The polarizer according to claim 3,
   wherein the crystallization temperature of the polarizer-forming composition is 85° C. or lower.

5. The polarizer according to claim 1, wherein the peak intensity of the peak A1 is 500 cps or greater.

6. The polarizer according to claim 1,
   wherein the mesogen group represented by M1 in Formula (1) contains three aromatic hydrocarbon groups.

7. The polarizer according to claim 1,
   wherein the spacer group represented by SP1 in Formula (1) is a group represented by *—(CH$_2$—CH$_2$O)$_3$—*, where a symbol * represents a bonding position with respect to L1 or M1 in Formula (1).

8. The polarizer according to claim 1,
   wherein the terminal group represented by T1 in Formula (1) is a methoxy group.

9. The polarizer according to claim 1,
wherein the polymer liquid crystal compound has two kinds of repeating units represented by Formula (1),
in one repeating unit, T1 in Formula (1) represents an alkoxy group, and
in the other repeating unit, T1 in Formula (1) represents a group other than the alkoxy group.

10. An image display device comprising:
the polarizer according to claim 1.

11. The polarizer according to claim 1,
wherein the content of the dichroic material is in a range of 5 to 30 parts by mass with respect to 100 parts by mass of the polymer liquid crystal compound.

12. The polarizer according to claim 1,
wherein, in the polymer liquid crystal compound which has two kinds of repeating units represented by Formula (1),
in one repeating unit A, T1 in Formula (1) represents an alkoxy group,
in the other repeating unit B, T1 in Formula (1) represents a group other than the alkoxy group, and
the ratio A/B between the content of the repeating unit A in the polymer liquid crystal compound and the content of the repeating unit B in the polymer liquid crystal compound is in a range of 70/30 to 85/15.

13. The polarizer according to claim 1,
wherein in Formula (1), T1 represents one of a halogen atom, a cyano group or —$NO_2$.

14. The polarizer according to claim 2,
wherein the crystallization temperature of the polymer liquid crystal compound is 95° C. or lower.

15. The polarizer according to claim 2,
wherein a crystallization temperature of the polarizer-forming composition is 100° C. or lower.

16. The polarizer according to claim 15,
wherein the crystallization temperature of the polarizer-forming composition is 85° C. or lower.

17. The polarizer according to claim 2, wherein the peak intensity of the peak A1 is 500 cps or greater.

18. The polarizer according to claim 2,
wherein the mesogen group represented by M1 in Formula (1) contains three aromatic hydrocarbon groups.

19. An image display device comprising:
the polarizer according to claim 2.

* * * * *